US011816283B2

(12) United States Patent
Li et al.

(10) Patent No.: US 11,816,283 B2
(45) Date of Patent: Nov. 14, 2023

(54) TOUCH PANEL, PREPARATION METHOD THEREOF AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Meng Li, Beijing (CN); Chao Zeng, Beijing (CN); Weiyun Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 246 days.

(21) Appl. No.: 17/298,033

(22) PCT Filed: Sep. 7, 2020

(86) PCT No.: PCT/CN2020/113834
§ 371 (c)(1),
(2) Date: May 28, 2021

(87) PCT Pub. No.: WO2022/047800
PCT Pub. Date: Mar. 10, 2022

(65) Prior Publication Data
US 2022/0317848 A1 Oct. 6, 2022

(51) Int. Cl.
*G06F 3/041* (2006.01)
*G06F 3/044* (2006.01)
*H10K 59/131* (2023.01)

(52) U.S. Cl.
CPC ........ *G06F 3/04164* (2019.05); *G06F 3/0443* (2019.05); *G06F 3/0412* (2013.01);
(Continued)

(58) Field of Classification Search
None
See application file for complete search history.

(56) References Cited

U.S. PATENT DOCUMENTS

2016/0253009 A1  9/2016 Taofeng et al.
2016/0342240 A1  11/2016 Zou et al.
(Continued)

FOREIGN PATENT DOCUMENTS

CN    202454298 U   *   9/2012
CN    104216564 A   *   12/2014
(Continued)

*Primary Examiner* — Duane N Taylor, Jr.
(74) *Attorney, Agent, or Firm* — Ling Wu; Stephen Yang; Ling and Yang Intellectual Property

(57) ABSTRACT

A touch panel, preparation method thereof and display apparatus. The touch panel includes a touch region and a binding region, wherein the touch region includes n touch sub-regions disposed sequentially along a second direction, and at least one touch sub-region includes multiple touch electrodes and multiple touch traces; the binding region includes a trace lead-out region adjacent to the touch region, and the trace lead-out region includes n lead convergence regions disposed sequentially along the second direction; first ends of multiple touch traces in an i-th touch sub-region are connected respectively to multiple touch electrodes in the i-th touch sub-region, and second ends of the multiple touch traces in the i-th touch sub-region extend to an i-th lead convergence region of the trace lead-out region; n is a positive integer greater than 2, i=1, 2, ..., n, and the second direction crosses the first direction.

19 Claims, 10 Drawing Sheets

(52) U.S. Cl.
    CPC .. *G06F 3/0446* (2019.05); *G06F 2203/04111* (2013.01); *H10K 59/131* (2023.02)

(56) References Cited

U.S. PATENT DOCUMENTS

2019/0095027 A1\* 3/2019 Zhang ................ G06F 3/04166
2019/0204948 A1   7/2019 Xie et al.
2022/0052081 A1\* 2/2022 Zhang ................ H01L 27/1259

FOREIGN PATENT DOCUMENTS

| | | | |
|---|---|---|---|
| CN | 104281327 A | 1/2015 | |
| CN | 104850286 A | 8/2015 | |
| CN | 106802735 A | 6/2017 | |
| CN | 104850291 B \* | 11/2017 | ........... G06F 3/0412 |
| CN | 108196737 A | 6/2018 | |
| CN | 109669575 A \* | 4/2019 | ........... G06F 3/0412 |

\* cited by examiner

TOUCH PANEL, PREPARATION METHOD THEREOF AND DISPLAY APPARATUS

CROSS-REFERENCE TO RELATED APPLICATION

The present application is a U.S. National Phase Entry of International Application PCT/CN2020/113834 having an international filing date of Sep. 7, 2020, the content of which should be construed as being incorporated herein by reference.

TECHNICAL FIELD

The present disclosure relates to, but is not limited to, the field of display technology, and in particular, to a touch panel, a preparation method thereof and a display apparatus.

BACKGROUND

Organic light-emitting diodes (abbreviated as OLEDs) are active light-emitting display devices with advantages of self-illumination, wide viewing angle, high contrast, low power consumption, extremely high response speed, etc. With the continuous development of display technology, flexible display apparatuses which use OLEDs as light-emitting devices and control signals by thin film transistors (TFTs) have become mainstream products in the current display field.

SUMMARY

A summary of the subject matter described in detail herein is provided below. The summary is not intended to limit the protection scope of the claims.

In one aspect, an exemplary embodiment of the present disclosure provides a touch panel including a touch region and a binding region located on one side of a first direction of the touch region; wherein the touch region includes n touch sub-regions disposed sequentially along a second direction, and at least one touch sub-region includes multiple touch electrodes and multiple touch traces; the binding region includes a trace lead-out region adjacent to the touch region, and the trace lead-out region includes n lead convergence regions disposed sequentially along the second direction; first ends of a multiple touch traces in an i-th touch sub-region are connected respectively to a multiple touch electrodes in the i-th touch sub-region, and second ends of the multiple touch traces in the i-th touch sub-region extend to an i-th lead convergence region in the trace lead-out region; in the first direction, the i-th lead convergence region does not overlap with other touch sub-regions except the i-th touch sub-region, or other lead convergence regions except the i-th lead convergence region do not overlap with the i-th touch sub-region; wherein n is a positive integer greater than 2, i=1, 2, . . . , n, and the second direction crosses the first direction.

In the exemplary embodiment, the i-th lead convergence region includes multiple fold lines, which are configured to be electrically connected to the multiple touch traces in the i-th touch sub-region and converge together to form the i-th lead convergence region; convergence directions of the fold lines in the n lead convergence regions are asymmetric with respect to a center line extending along the first direction in the trace lead-out region.

In the exemplary embodiment, the convergence directions of the fold lines in the n lead convergence regions being asymmetric with respect to the center line extending along the first direction in the trace lead-out region includes any one or more of following cases: a quantity of fold lines bending towards the second direction in a first lead convergence region is different from a quantity of fold lines bending towards the second direction in an n-th lead convergence region, or a quantity of fold lines bending towards the second direction in a second lead convergence region is different from a quantity of fold lines bending towards the second direction in an (n−1)-th lead convergence region.

In the exemplary embodiment, the binding region further includes a bending region located on one side of the trace lead-out region away from the touch region; at least one of the lead convergence regions includes multiple first fold lines and multiple second fold lines; first ends of the first fold lines are connected to the touch traces in the touch region, and second ends of the first fold lines bend towards the second direction and extend to the bending region; first ends of the second fold lines are connected to the touch traces in the touch region, and second ends of the second fold lines bend towards an opposite direction of the second direction and extend to the bending region.

In the exemplary embodiment, the first fold lines at least include first lead-out lines, first turning lines and first extension lines which are connected sequentially; first ends of the first lead-out lines are connected to the touch traces in the touch region, and second ends of the first lead-out lines are connected to first ends of the first turning lines after extending towards the first direction; second ends of the first turning lines are connected to first ends of the first extension lines after extending towards the second direction; second ends of the first extension lines extend towards the first direction to the bending region; and the second fold lines at least include second lead-out lines, second turning lines and second extension lines which are connected sequentially; first ends of the second lead-out lines are connected to the touch traces in the touch region, and second ends of the second lead-out lines are connected to first ends of the second turning lines after extending towards the first direction; second ends of the first turning lines are connected to first ends of the second extension lines after extending towards the opposite direction of the second direction; second ends of the second extension lines extend towards the first direction to the bending region.

In the exemplary embodiment, the touch region includes N electrode regions and N lead regions which are disposed alternately along the second direction, at least one of the electrode regions includes M touch electrodes arranged sequentially along the first direction, and at least one lead region includes M touch traces arranged sequentially along the second direction; a first end of at least one touch trace of the M touch traces is connected to one touch electrode, and a second end of the touch trace extends to the trace lead-out region of the binding region along the first direction; wherein M and N are positive integers greater than 2.

In the exemplary embodiment, the touch region includes five touch sub-regions disposed sequentially along the second direction, and the trace lead-out region includes five lead convergence regions disposed sequentially along the second direction.

In the exemplary embodiment, the five touch sub-regions include a first, second, third, fourth and fifth touch sub-regions, each of the first, third and fifth touch sub-regions includes four electrode regions and four lead regions, and each of the second and fourth touch sub-regions includes two electrode regions and two lead regions; the five lead convergence regions include a first, second, third, fourth and fifth lead convergence regions, the first lead convergence region is configured to converge 4M touch traces in the four lead regions in the first touch sub-region, the second lead convergence region is configured to converge 2M touch traces in the two lead regions in the second touch sub-region, the third lead convergence region is configured to converge 4M touch traces in the four lead regions in the third touch sub-region, the fourth lead convergence region is configured to converge 2M touch traces in the two lead regions in the fourth touch sub-region, and the fifth lead convergence region is configured to converge 4M touch traces in the four lead regions in the fifth touch sub-region.

In the exemplary embodiment, the first lead convergence region includes 2M first fold lines bending towards the second direction and 2M second fold lines bending towards the opposite direction of the second direction.

In the exemplary embodiment, the second lead convergence region includes 2M second fold lines bending towards the opposite direction of the second direction.

In the exemplary embodiment, the third lead convergence region includes M first fold lines bending towards the second direction and 3M second fold lines bending towards the opposite direction of the second direction.

In the exemplary embodiment, the fourth lead convergence region includes M first fold lines bending towards the second direction and M second fold lines bending towards the opposite direction of the second direction.

In the exemplary embodiment, the fifth lead convergence region includes M first fold lines bending towards the second direction and 3M second fold lines bending towards the opposite direction of the second direction.

In the exemplary embodiment, the first fold lines and the second fold lines are mirror-symmetric with respect to a center line of the first fold lines and the second fold lines.

In the exemplary embodiment, the binding region further includes a bending region located on one side of the trace lead-out region away from the touch region and a circuit region located on one side of the bending region away from the touch region; the bending region includes n connecting line convergence regions disposed sequentially along the second direction, and the circuit region includes m output line convergence regions disposed at intervals along the second direction and multiple multiplexer circuits; an i-th connecting line convergence region includes multiple connecting lines, first ends of the multiple connecting lines in the i-th connecting line convergence region are connected respectively to second ends of a multiple fold lines in the i-th connecting line convergence region, second ends of the multiple connecting lines in the i-th connecting convergence region are connected to first ends of multiple output lines in a j-th output line convergence region, and second ends of the multiple output lines in the j-th output line convergence region are connected to the multiplexer circuits; wherein m is a positive integer greater than or equal to 2, and m is less than n, i=1, 2, . . . , n, j=1, 2, . . . , m.

In the exemplary embodiment, the bending region includes a first, second, third, fourth and fifth connecting line convergence regions disposed sequentially along the second direction; the circuit region includes two output line convergence regions and two multiplexer circuits.

First ends of multiple output lines in the first output line convergence region are connected respectively to second ends of multiple connecting lines in the first, the second and the third connecting line convergence regions, and second ends of the multiple output lines in the first output line convergence region are connected to a first multiplexer circuit; first ends of a multiple output lines in a second output line convergence region are connected respectively to second ends of multiple connecting lines in the fourth and the fifth connecting line convergence regions, and second ends of the multiple output lines in the second output line convergence region are connected to a second multiplexer circuit; or the first ends of the multiple output lines in the first output line convergence region are connected respectively to the second ends of the multiple connecting lines in the first and the second connecting line convergence regions, and the second ends of the multiple output lines in the first output line convergence region are connected to the first multiplexer circuit; the first ends of the multiple output lines in the second output line convergence region are connected respectively to the second ends of the multiple connecting lines in the third, fourth and fifth connecting line convergence regions, and the second ends of the multiple output lines in the second output line convergence region are connected to the second multiplexer circuit; or the first ends of the multiple output lines in the first output line convergence region are connected respectively to the second ends of all connecting lines in the first connecting line convergence region, all connecting lines in the second connecting line convergence region and part of the connecting lines in the third connecting line convergence region, and the second ends of the multiple output lines in the first output line convergence region are connected to the first multiplexer circuit; the first ends of the multiple output lines in the second output line convergence region are connected respectively to second ends of another part of the connecting lines in the third connecting line convergence region, all connecting lines in the fourth connecting line convergence region and all connecting lines in the fifth connecting line convergence region, and the second ends of the multiple output lines in the second output line convergence region are connected to the second multiplexer circuit.

In the exemplary embodiment, the touch region includes N composite electrode regions disposed sequentially along the second direction, and at least one of the composite electrode regions includes M touch electrodes arranged sequentially along the first direction and M touch traces arranged sequentially along the second direction, and there is an overlapping region between an orthogonal projection of the M touch traces on a plane of the touch panel and an orthogonal projection of the M touch electrodes on the plane of the touch panel; a first end of at least one touch trace of the M touch traces is connected to one of the touch electrodes, and a second end of the touch trace extends to the trace lead-out region of the binding region along the first direction; wherein M and N are positive integers greater than 2.

In the exemplary embodiment, in a plane perpendicular to the touch panel, the bending region of the binding region includes:
  a composite insulating layer disposed on a base substrate, wherein grooves are formed on the composite insulating layer;
  a first planarization layer disposed on the composite insulating layer, wherein the first planarization layer fills the grooves;
  connecting lines arranged on the first planarization layer, wherein the connecting lines are provided with anti-fracture structures;
  a first protective layer disposed on the connecting lines, wherein a position of the first protective layer corresponds to positions of the anti-fracture structures;
  a second protective layer disposed on the connecting lines and the first protective layer, wherein first lead via holes and second lead via holes exposing the connecting lines are formed on the second protective layer, the first lead via holes are located at first ends of the connecting lines adjacent to the touch region, and the second lead via holes are located at the second ends of the connecting lines away from the touch region; and fold lines and output lines arranged on the second protective layer, wherein the fold lines are connected to the first ends of the connecting lines through the first lead via holes, and the output lines are connected to the second ends of the connecting lines through the second lead via holes.

In the exemplary embodiment, the trace lead-out region of the binding region further includes a first power supply line and a second power supply line; there is an overlapping region between an orthogonal projection of the n lead convergence regions on the plane of the touch panel and an orthogonal projection of the first power supply line or the second power supply line on the plane of the touch panel.

In the exemplary embodiment, the circuit region of the binding region further includes a first power supply line and a second power supply line; there is an overlapping region between an orthogonal projection of the m output line convergence regions on a plane of the touch panel and an orthogonal projection of the first power supply line or the second power supply line on the plane of the touch panel.

In another aspect, an exemplary embodiment of the present disclosure further provides a display apparatus including the aforementioned touch panel.

In another aspect, an exemplary embodiment of the present disclosure further provides a method for preparing a touch panel, wherein the touch panel includes a touch region and a binding region located on one side of a first direction of the touch region, and the binding region includes a trace lead-out region adjacent to the touch region; the preparation method includes:

forming n touch sub-regions disposed sequentially along a second direction in the touch region, and forming n lead convergence regions disposed sequentially along the second direction in the trace lead-out region, wherein at least one of the touch sub-regions includes multiple touch electrodes and multiple touch traces; and connecting first ends of\multiple touch traces in an i-th touch sub-region to multiple touch electrodes in the i-th touch sub-region respectively, and extending second ends of the multiple touch traces in the i-th touch sub-region to an i-th lead convergence region in the trace lead-out region; wherein in a first direction, the i-th lead convergence region does not overlap with other touch sub-regions except the i-th touch sub-region, or other lead convergence regions except the i-th lead convergence region do not overlap with the i-th touch sub-region; n is a positive integer greater than 2, i=1, 2, . . . , n, and the second direction crosses the first direction.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of various components in the drawings do not reflect true scales and are intended to illustrate schematically contents of the present disclosure only.

DESCRIPTION OF REFERENCE SIGNS

Figure 1:
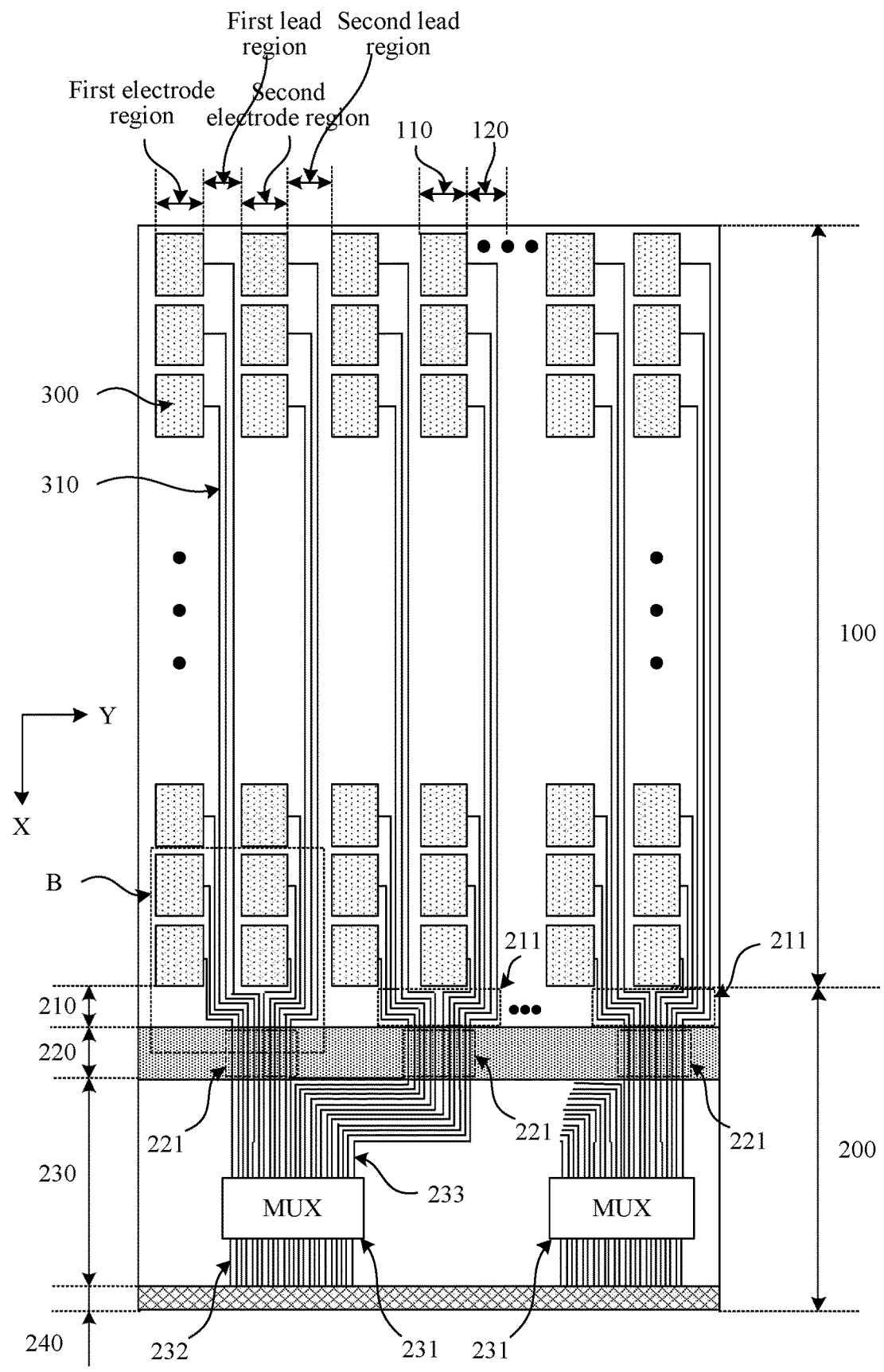
FIG. 1 is a schematic diagram of a structure of a touch panel according to an exemplary embodiment of the present disclosure.

10—base substrate;
11—first insulating layer;
12—second insulating layer;
13—third insulating layer;
14—fourth insulating layer;
15—fifth insulating layer;
16—first planarization layer;
17—second planarization layer;
21—anode;
22—pixel definition layer;
23—organic light emitting layer;
24—cathode;
25—first encapsulation layer;
26—second encapsulation layer;
27—third encapsulation layer;
30—touch electrode layer;
31—connecting line;
32—anti-fracture structure;
33—first protective layer;
34—second protective layer;
35—post spacer;
100—touch region;
101—thin film transistor;
102—storage capacitor;

103—first connection electrode;
104—second connection electrode;
105—third connection electrode;
110—electrode region;
120—lead region;
200—binding region;
210—trace lead-out region;
211—lead convergence region;
220—bending region;
221—connecting line convergence region;
230—circuit region;
231—selector circuit;
232—input line;
233—output line;
240—binding pin region;
300—touch electrode;
310—touch trace;
410—first supporting dam;
420—second supporting dam;
501—first lead convergence region;
502—second lead convergence region;
503—third lead convergence region;
504—fourth lead convergence region;
505—fifth lead convergence region;
511—first touch sub-region;
512—second touch sub-region;
513—third touch sub-region;
514—fourth touch sub-region;
515—fifth touch sub-region;
601—first lead group;
602—second lead group;
603—third lead group;
604—fourth lead group;
701—first touch unit;
702—first touch electrode;
703—first connecting portion;
704—first touch trace;
801—second touch unit;
802—second touch electrode;
803—second connecting portion;
804—second touch trace.

DETAILED DESCRIPTION

Embodiments of the present disclosure will be described in detail hereinafter with reference to the accompanying drawings. It should be noted that the embodiments may be implemented in many different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements and thicknesses and regions of layers are sometimes exaggerated for clarity. Therefore, an implementation of the present disclosure is not necessarily limited to the sizes shown. The shapes and sizes of various components in the drawings do not reflect true scales. In addition, the drawings schematically show ideal examples, and an implementation of the present disclosure is not limited to the shapes or values shown in the drawings.

The ordinal numbers "first", "second", "third", "1st", "2nd", "3rd" and the like in this specification are provided in order to avoid confusion among the constituent elements, but not to constitute limitations in terms of quantity.

In this specification, for sake of convenience, wordings, such as "central", "upper", "lower", "front", "rear", "vertical", "horizontal", "top", "bottom", "inner", "outer" and the like which are used to indicate orientational or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure according to situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. It should be noted that in this specification, the channel region refers to a region through which current mainly flows.

In this specification, the first electrode may be a drain electrode and the second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element with a certain electric action. The "element with a certain electric action" is not particularly limited as long as it can transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10° and below 10°, and thus also includes a case where the angle is above −5° and below 5°. In addition, "perpendicular" refers to a case where an angle formed by two straight lines is above −80° and below 100°, and thus also includes a case where the angle is above −85° and below 95°.

In this specification, "film" and "layer" may be interchangeable. For example, sometimes "conductive layer" may be replaced by "conductive film". Similarly, "insulating film" may sometimes be replaced by "insulating layer".

"About" in the present disclose means that limits of a value are not limited strictly, and the value is within a range of process and measurement errors.

Touch panels are mainly divided into touch panels with a mutual capacitance structure and touch panels with a self-capacitance structure. In the mutual capacitance structure, mutual capacitance is formed by overlapping between the first touch electrode and the second touch electrode, and position detection is performed using changes in mutual capacitance. In the self-capacitance structure, self-capacitance is formed by a touch electrode and a human body, and position detection is performed using changes in self-capacitance. The touch panel with the self-capacitance structure has a single-layer structure and has features such as low power consumption and simple structure. The touch panel with a mutual capacitance structure has a multi-layer structure and has features such as multi-touch.

An exemplary embodiment of the present disclosure provides a touch panel including a touch region and a binding region located on one side of a first direction of the touch region; wherein the touch region includes n touch sub-regions disposed sequentially along a second direction, and at least one touch sub-region includes multiple touch electrodes and multiple touch traces; the binding region includes a trace lead-out region adjacent to the touch region, and the trace lead-out region includes n lead convergence regions disposed sequentially along the second direction; first ends of multiple touch traces in an i-th touch sub-region are connected respectively to multiple touch electrodes in the i-th touch sub-region, and second ends of the multiple touch traces in the i-th touch sub-region extend to an i-th lead convergence region in the trace lead-out region; in the first direction, the i-th lead convergence region does not overlap with other touch sub-regions except the i-th touch sub-region, or other lead convergence regions except the i-th lead convergence region do not overlap with the i-th touch sub-region; wherein n is a positive integer greater than 2, i=1, 2, . . . , n, and the second direction crosses the first direction.

In the exemplary embodiment, the i-th lead convergence region includes multiple fold lines, which are configured to be electrically connected to the multiple touch traces in the i-th touch sub-region and converge together to form the i-th lead convergence region; convergence directions of the fold lines in the n lead convergence regions is asymmetric with respect to a center line of the trace lead-out region extending along the first direction.

In the exemplary embodiment, the convergence directions of the fold lines in the n lead convergence regions being asymmetric with respect to the center line of the trace lead-out region extending along the first direction includes any one or more of the following cases: a quantity of fold lines bending towards the second direction in a first lead convergence region is different from a quantity of fold lines bending towards the second direction in an n-th lead convergence region, or a quantity of fold lines bending towards the second direction in a second lead convergence region is different from a quantity of fold lines bending towards the second direction in an (n−1)-th lead convergence region.

In the exemplary embodiment, the binding region further includes a bending region located on one side of the trace lead-out region away from the touch region; at least one lead convergence region includes multiple first fold lines and multiple second fold lines; first ends of the first fold lines are connected to the touch traces in the touch region, and second ends of the first fold lines bend towards the second direction and extend to the bending region; first ends of the second fold lines are connected to the touch traces in the touch region, and second ends of the second fold lines bend towards an opposite direction of the second direction and extend to the bending region.

In the exemplary embodiment, the touch region includes N electrode regions and N lead regions which are disposed alternately along the second direction, wherein at least one electrode region includes M touch electrodes arranged sequentially along the first direction, and at least one lead region includes M touch traces arranged sequentially along the second direction; for at least one touch trace among the M touch traces, a first end of the touch trace is connected to one touch electrode, and a second end of the touch trace extends to the trace lead-out region of the binding region along the first direction; wherein M and N are positive integers greater than 2.

In the exemplary embodiment, the binding region further includes a bending region located on one side of the trace lead-out region away from the touch region and a circuit region located on one side of the bending region away from the touch region; the bending region includes n connecting line convergence regions disposed sequentially along the second direction, and the circuit region includes m output line convergence regions and multiple selector circuits disposed at intervals along the second direction; an i-th connecting line convergence region includes multiple connecting lines, wherein first ends of the multiple connecting lines in the i-th connecting line convergence region are connected respectively to second ends of the multiple fold lines in the i-th connecting line convergence region, second ends of the multiple connecting lines in the i-th connecting convergence region are connected to first ends of multiple output lines in a j-th output line convergence region, and second ends of the multiple output lines in the j-th output line convergence region are connected to a multiplexer circuit; wherein m is a positive integer greater than or equal to 2, and m is less than n, i=1, 2, . . . , n, j=1, 2, . . . , m.

FIG. 1 is a schematic diagram of a structure of a touch panel according to an exemplary embodiment of the present disclosure, which illustrates a self-capacitance structure. As shown in FIG. 1, in a plane parallel to the touch panel, the touch panel includes a touch region 100 and a binding region 200 located on one side of a first direction X of the touch region 100. The touch region 100 includes multiple touch electrodes 300 arranged regularly. In an exemplary embodiment, the touch electrodes 300 are rectangular and arranged in a matrix of M rows*N columns. The touch region 100 may be divided into N electrode regions 110 and N lead regions 120. The electrode regions 110 and lead regions 120 are strip-shaped regions extending along the first direction X, and the strip-shaped electrode regions 110 and the strip-shaped lead regions 120 are alternately disposed along a second direction Y, i.e., one lead region 120 is disposed between two electrode regions 110 and one electrode region 110 is disposed between two lead regions 120, except for the electrode regions and lead regions at edge positions. Each electrode region 110 includes M touch electrodes 300 arranged sequentially along the first direction X, and each lead region 120 includes M touch traces 310 arranged sequentially along the second direction Y. A first end of each touch trace 310 is connected to one touch electrode 300, and its second end extends to the binding region 200 along the first direction X.

In the exemplary embodiment, the touch electrodes 300 may be of a regular pattern of about 4 mm*4 mm or 5 mm*5 mm, wherein the regular pattern may be a rectangle, a rhombus, a triangle or a polygon. During operation, a touch of a human finger will cause changes in self-capacitance of the corresponding touch electrodes, and an external control device can determine a position of the finger according to capacitance changes of the touch electrodes.

In the exemplary embodiment, along the first direction X (i.e., the direction away from the touch region 100), the binding region 200 may include a trace lead-out region 210, a bending region 220, a circuit region 230, and a binding pin region 240 which are disposed sequentially. The trace lead-out region 210 may be provided with multiple fold lines. First ends of the multiple fold lines are connected respectively to multiple touch traces 310 in the touch region 100, and second ends of the multiple fold lines extend towards the bending region 220 and are connected respectively to multiple connecting lines arranged in the bending region 220. The bending region 220 is configured to bend the circuit region 230 and the binding pin region 240 in the binding region 200 to the back of the touch region 100. The circuit region 230 may be provided with multiplexer (MUX) circuits, multiple output lines and multiple input lines. The multiplexer circuits are configured to make selection of the multiple output lines to reduce the number of output lines. The binding pin region 205 may be provided with multiple pins, through which the multiplexer circuits are connected to multiple input lines. The multiple pins are configured to be connected to an external control device through a bound flexible printed circuit board (FPC). In some possible implementations, the circuit region 230 may be provided with a touch and display driver integration (TDDI) circuit.

In an exemplary embodiment, the touch region 100 may include n1 touch sub-regions, wherein the n1 touch sub-regions are disposed at intervals along the second direction Y. At least one touch sub-region includes two adjacent electrode regions 110 and two adjacent lead regions 120, i.e., 2M touch electrodes and 2M touch traces, wherein first ends of the 2M touch traces are connected respectively to the 2M touch electrodes, and second ends of 2M touch traces extend to the trace lead-out region 210. In an exemplary embodiment, the trace lead-out region 210 may include n1 lead convergence regions 211, wherein the n1 lead convergence regions 211 are disposed at intervals along the second direction Y. At least one lead convergence region 211 is configured to converge the 2M touch traces in two adjacent lead regions 120 of a corresponding touch sub-region to connect them to multiple connecting lines disposed in the bending region 220. In an exemplary embodiment, $n1=\lfloor N/2 \rfloor$, and $\lfloor N/2 \rfloor$ indicates rounding down.

In the exemplary embodiment, in the first direction X, positions of the n1 lead convergence regions 211 correspond to positions of the n1 touch sub-regions in one-to-one correspondence, and the i-th lead convergence region does not overlap with other touch sub-regions except the i-th touch sub-region, or other lead convergence regions except the i-th lead convergence region do not overlap with the i-th touch sub-region, i=1, 2, ..., n1.

In an exemplary embodiment, the first touch sub-region includes a first electrode region, a first lead region, a second electrode region and a second lead region. In the first direction X, the first touch sub-region only overlaps with the first lead convergence region, and the first touch sub-region does not overlap with the second, third, ..., n1-th lead convergence regions. Or, in the first direction X, the first lead convergence region only overlaps with the first touch sub-region, and the first lead convergence region does not overlap with any of the second, third, ..., n1-th touch sub-regions. In an exemplary embodiment, the n1-th touch sub-region includes the (N−1)-th electrode region, the (N−1)-th lead region, the N-th electrode region and the N-th lead region. In the first direction X, the n1-th touch sub-region only overlaps with the n1-th lead convergence region, and the n1-th touch sub-region does not overlap with any of the first, second, ..., (n1−1)th lead convergence regions. Or, in the first direction X, the n1-th lead convergence region only overlaps with the n1-th touch sub-region, and the n1-th lead convergence region does not overlap with any of the first, second, ..., (n1−1)-th touch sub-regions.

In an exemplary embodiment, at least one lead convergence region 211 may be located between two adjacent lead regions 120. For example, the first lead convergence region is located between the first lead region and the second lead region. Because the second electrode is provided between the first lead region and the second lead region, the position of the first lead convergence region may correspond to the position of the second electrode region.

In an exemplary embodiment, the trace lead-out region 210 is a strip-shaped region extending along the second direction Y and has a center line extending along the first direction X, wherein the center line may have the length (a characteristic dimension extending along the second direction Y) of the strip-shaped region.

In an exemplary embodiment, the i-th lead convergence region includes multiple fold lines, which are configured to be electrically connected to multiple touch traces in the corresponding i-th touch sub-region and converge together to form the i-th lead convergence region. The convergence directions of the fold lines in the n1 lead convergence regions in the trace lead-out region 210 are asymmetric with respect to the center line of the trace lead-out region 210.

In an exemplary embodiment, the convergence directions of the fold lines in the n1 lead convergence regions in the trace lead-out region 210 being asymmetric with respect to the center line of the trace lead-out region 210 includes any one or more of the following cases: a quantity of fold lines bending towards the second direction Y in the first lead convergence region is different from a quantity of fold lines bending towards the second direction Y in the n1-th lead convergence region, a quantity of fold lines bending towards the second direction Y in the second lead convergence region is different from a quantity of fold lines bending towards the second direction Y in the (n−1)-th lead convergence r, or a quantity of fold lines bending towards the second direction Y in the third lead convergence region is different from a quantity of fold lines bending towards the second direction Y in the (n−2)-th lead convergence region.

In an exemplary embodiment, at least one lead convergence region may include two lead groups. A first lead group includes M first fold lines arranged sequentially, and a second lead group includes M second fold lines arranged sequentially. First ends of the M first fold lines of the first lead group are connected respectively to M touch traces in one lead region, and their second ends bend towards the second direction Y (right side) in the horizontal direction, extend towards the first direction (lower side) in the vertical direction, and are connected respectively to M connecting lines in the bending region 220 after extending to the bending region 220. First ends of the M second fold lines of the second lead group are connected respectively to M touch traces in another lead region, and their second ends bend towards the opposite direction (left side) of the second direction Y in the horizontal direction, extend towards the first direction (lower side) in the vertical direction, and are connected respectively to M connecting lines in the bending region 220 after extending to the bending region 220.

In an exemplary embodiment, at least one first fold line of the M first fold lines included in the first lead group includes at least a first lead-out line, a first turning line and a first extension line which are connected sequentially. The first lead-out line and the first extension line may extend along the first direction X and the first turning line may extend along the second direction Y. A first end of the first lead-out line is connected to one touch trace in the lead region, a second end of the first lead-out line is connected to a first end of the first turning line after extending towards the first direction X, a second end of the turning line is connected to a first end of the first extension line after extending towards the second direction Y, and a second end of the first extension line is connected to one connecting line in the bending region 220 after extending towards the first direction X to reach the bending region 220. Thus, the first lead-out line, the first turning line and the first extension line connected sequentially form a fold line with two fold angles, with the first end of the first lead-out line serving as a first end of the first fold line and the second end of the first extending line serving as a second end of the first fold line, so that M touch traces in the lead region converge to the lead convergence region.

In an exemplary embodiment, at least one second fold line of the M second fold lines included in the second lead group includes at least a second lead-out line, a second turning line and a second extension line which are connected sequentially. The second lead-out line and the second extension line may extend along the first direction X and the second turning line may extend along the opposite direction to the second direction Y. A first end of the second lead-out line is connected to one touch trace in the lead region, a second end of the second lead-out line is connected to a first end of the second turning line after extending towards the first direction X, a second end of the second turning line is connected to a first end of the second extension line after extending towards the opposite direction of the second direction Y, and a second end of the second extension line is connected to one connecting line in the bending region 220 after extending towards the first direction X to reach the bending region 220. Thus, the second lead-out line, the second turning line and the second extension line connected sequentially form a fold line with two fold angles, with the first end of the second lead-out line serving as a first end of the second fold line and the second end of the second extension line serving as a second end of the second fold line, so that M touch traces in the lead region converge to the lead convergence region.

In some possible implementations, the first direction X may be the vertical direction or a direction with a set included angle with respect to the vertical direction, the second direction Y may be the horizontal direction or a direction with a set included angle with respect to the horizontal direction, and the opposite direction of the second direction Y may be the horizontal direction or a direction with a set included angle with respect to the horizontal direction, the disclosure is not limited thereto.

In an exemplary embodiment, the bending region 220 may include n1 connecting line convergence regions 221, wherein the n1 connecting line convergence regions 221 are disposed at intervals along the second direction Y, and positions of the n1 connecting line convergence regions 221 correspond to positions of n1 lead convergence regions 211 in the trace lead-out region 210 in the first direction X. In an exemplary embodiment, the circuit region 230 may include M1 output line convergence regions and multiple multiplexer circuits 231 disposed at intervals along the second direction Y. The i-th connecting line convergence region may include multiple connecting lines, and the j-th output line convergence region may include multiple output lines 233. First ends of the multiple connecting lines in the i-th connecting line convergence region are connected respectively to second ends of multiple fold lines in the i-th lead convergence region, second ends of the multiple connecting lines in the i-th connecting line convergence region are connected to first ends of the multiple output lines 233 in the j-th output line convergence region, and the second ends of the multiple output lines 233 in the j-th output line convergence region are connected to a multiplexer circuit 231. m1 is a positive integer greater than or equal to 2, and m1 is less than n1, i=1, 2, . . . , n1, and j=1, 2, . . . , m1.

In an exemplary embodiment, the circuit region 230 may include multiple input lines 232, and the binding pin region 240 may include multiple pins. First ends of the multiple input lines 232 are connected respectively to multiple input ports of the multiplexer circuit 231, and second ends of the multiple input lines 232 are connected respectively to the multiple pins of the binding pin region 240.

In an exemplary embodiment, the circuit region 230 may include two output line convergence regions and two multiplexer circuits 231. The two multiplexer circuits 231 may be disposed respectively on two sides of the binding region 200 along the first direction X, thus multiple output lines 233 in the two output line convergence regions are connected respectively to the two multiplexer circuits 231. For example, the connecting lines in the first connecting line convergence region to the ⌊n1/2⌋ connecting line convergence region in the bending region 220 are connected respectively to first ends of the output lines in the first output line convergence region, and second ends of the output lines in the first output line convergence region are connected respectively to output ports of the multiplexer circuit 231 on the left (first multiplexer circuit). The connecting lines in other connecting line convergence regions in the bending region 220 are connected respectively to first ends of the output lines in the second output line convergence region, and second ends of the output lines in the second output line convergence region are connected respectively to output ports of the multiplexer circuit 231 on the right (second multiplexer circuit).

In an exemplary embodiment, the first output line convergence region may include about n1*M first output lines. First ends of the n1*M first output lines are connected respectively to n1*M connecting lines in the bending region 220, and second ends of the n1*M first output lines bend towards the opposite direction (left side) of the second direction Y in the horizontal direction, extend towards the first direction (lower side) in the vertical direction, and extend to the multiplexer circuit 231 on the left. The second output line convergence region may include about n1*M second output lines. First ends of the n1*M second output lines are connected respectively to n1*M connecting lines in the bending region 220, and second ends of the n1*M second output lines bend towards the second direction Y (right side) in the horizontal direction, extend towards the first direction (lower side) in the vertical direction and extend to the multiplexer circuit 231 on the right. Because the n1*M first output lines bend towards the left and the n1*M second output lines bend towards the right, the first output line convergence region and the second output line convergence region need about n1*M turning lines in the horizontal direction. Although there are many turning lines in the horizontal direction, Since these turning lines in the horizontal direction are arranged in the circuit region 230, the circuit region 230 will eventually bend to the back of the touch region 100, thus a wiring mode of the multiple output lines 233 in the circuit region 230 will not affect the bezel width of the touch panel.

Figure 2:
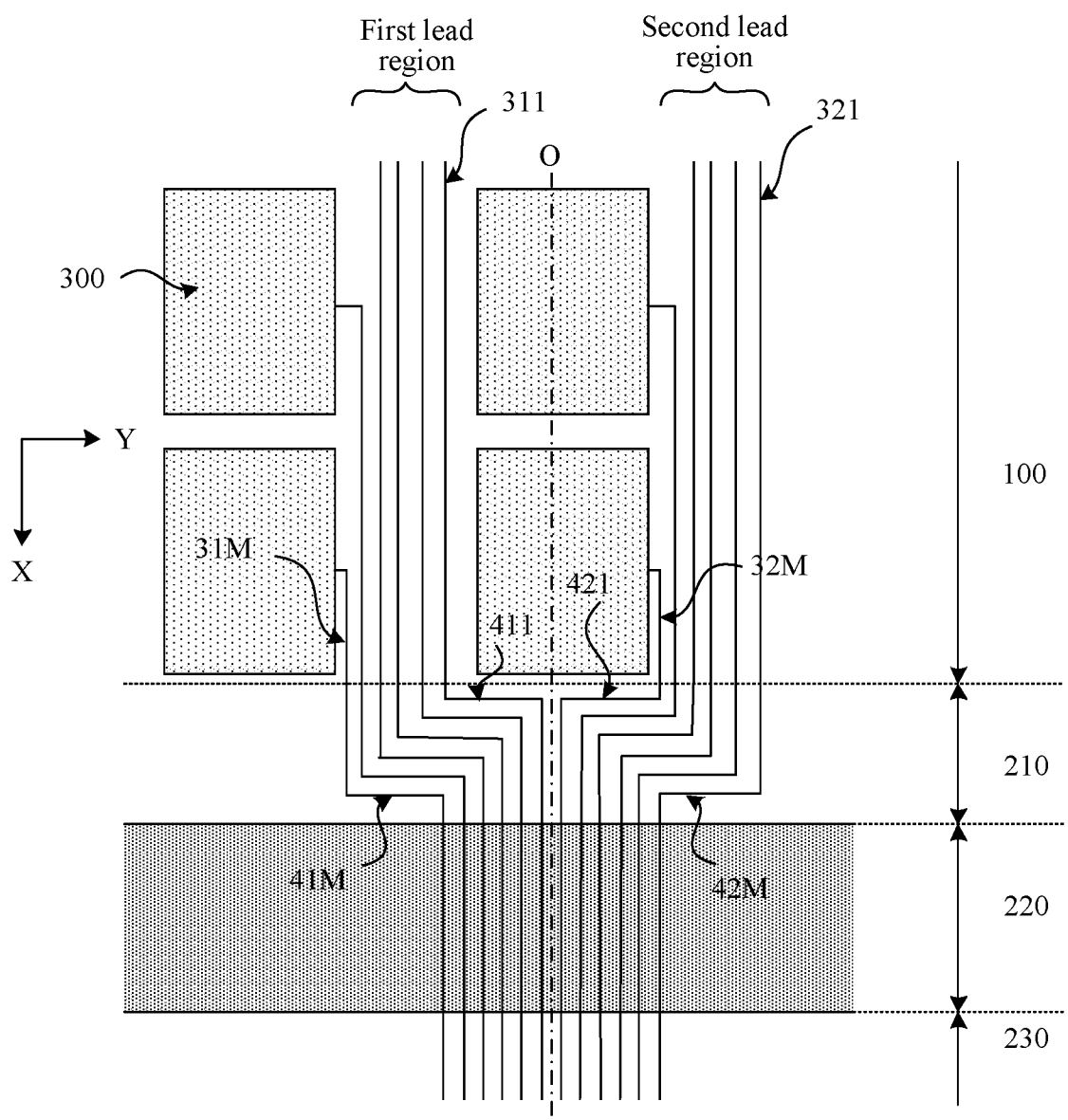
FIG. 2 is a schematic diagram of a lead convergence region according to an exemplary embodiment of the present disclosure.

FIG. 2 is a schematic diagram of a lead convergence region according to an exemplary embodiment of the present disclosure, which is an enlarged view of region B in FIG. 1. A fold line structure of the lead convergence region is illustrated by taking the first lead convergence region as an example. As shown in FIG. 2, the first lead convergence region includes 2M fold lines, wherein the 2M fold lines are configured to be electrically connected to M touch traces in the first lead region and M touch traces in the second lead region, converge together, and be connected respectively to 2M connecting lines arranged in the bending region 220.

In an exemplary embodiment, the first lead convergence region includes a first lead group and a second lead group. The first lead group includes M first fold lines arranged sequentially, wherein the M first fold lines are configured to establish connection between the M touch traces in the first lead region in the touch region 100 and M connecting lines in the bending region 220. The second lead group includes M second fold lines arranged sequentially, wherein the M second fold lines are configured to establish connection between the M touch traces in the second lead region in the touch region 100 and M connecting lines in the bending region 220.

In an exemplary embodiment, for the M touch traces in the first lead region, a touch trace 311 connected to a touch electrode 300 in the first row in the first electrode region is connected to a first fold line 411 in the first lead group after extending to the trace lead-out region 210 along the first direction X, . . . , a touch trace 31M connected to a touch electrode 300 in the M-th row in the first electrode region is connected to a first fold line 41M in the first lead group after extending to the trace lead-out region 210 along the first direction X. For the M touch traces in the second lead region, a touch trace 32M connected to a touch electrode 300 in the M-th row in the second electrode region is connected to a second fold line 421 in the second lead group after extending to the trace lead-out region 210 along the first direction X, . . . , a touch trace 321 connected to a touch electrode 300 in the first row in the second electrode region is connected to a second fold line 42M in the second lead group after extending to the trace lead-out region 210 along the first direction X.

In an exemplary embodiment, the first fold line 411 includes a first lead-out line, a first turning line and a first extension line. The first lead-out line is connected to the touch trace 311, the first fold line is connected to the first lead-out line, and the first extension line is connected to the first fold line. The second fold line 421 includes a second lead-out line, a second turning line and a second extension line. The second lead-out line is connected to the touch trace 32M, the second turning line is connected to the second lead-out line, and the second extension line is connected to the second turning line. The first extension line of the first fold line 411 is adjacent to the second extension line of the second fold line 421. A distance between the first extension line of the first fold line and the second extension line of the second fold line is smaller than a distance between the first lead-out line of the first fold line 411 and the second lead-out line of the second fold line 421. Since the extension direction of the first turning lines in the first lead group is opposite to the extension direction of the second turning lines in the second lead group, the first turning lines and the second turning lines can be arranged in parallel in the horizontal direction. A distance between the first turning line of the first fold line 411 and the touch region 100 may be equal to a distance between the second turning line of the second fold line 421 and the touch region 100, and a distance between the first turning line of the first fold line 41M and the touch region 100 may be equal to a distance between the second turning line of the second fold line 42M and the touch region 100.

In an exemplary embodiment, the M first fold lines in the first lead group and the M second fold lines in the second lead group may be mirror-symmetric with respect to a center line O of the first lead region and the second lead region. In an exemplary embodiment, the mirror symmetry may include any one or more of the cases that a first lead-out line of a K-th first fold line in the first lead group and a second lead-out line of a K-th second fold line in the second lead group are mirror-symmetric with respect to the center line O, a first turning line of the K-th first fold line in the first lead group and a second turning line of the K-th second fold line in the second lead group are mirror-symmetric with respect to the center line O, and a first extension line of the K-th first fold line in the first lead group and a second extension line of the K-th second fold line in the second lead group are mirror-symmetric with respect to the center line O, where K=1, 2, . . . , M.

As shown in FIGS. 1 and 2, in an exemplary embodiment of the present disclosure, by dividing the trace lead-out region into ⌊N/2⌋ lead convergence regions, at least one lead convergence region includes multiple first fold lines and multiple second fold lines bending towards each other. The first turning lines of the first fold lines and the second turning lines of the second fold lines are arranged in parallel in the horizontal direction, thus the first turning lines of the first fold lines and the second turning lines of the second fold lines are prevented from being arranged in parallel in the vertical direction, the space utilization rate of the multiple turning lines is increased, and the width occupied by the multiple turning lines in the trace lead-out region is reduced. Because only M turning lines extending along the horizontal direction are required to be arranged in the lead convergence region in the first direction X, the width occupied by the turning lines is small, such that the width required by the trace lead-out region can be effectively reduced, and the bending region can be closer to the touch region to facilitate the implementation of a narrow bezel.

Figure 3:
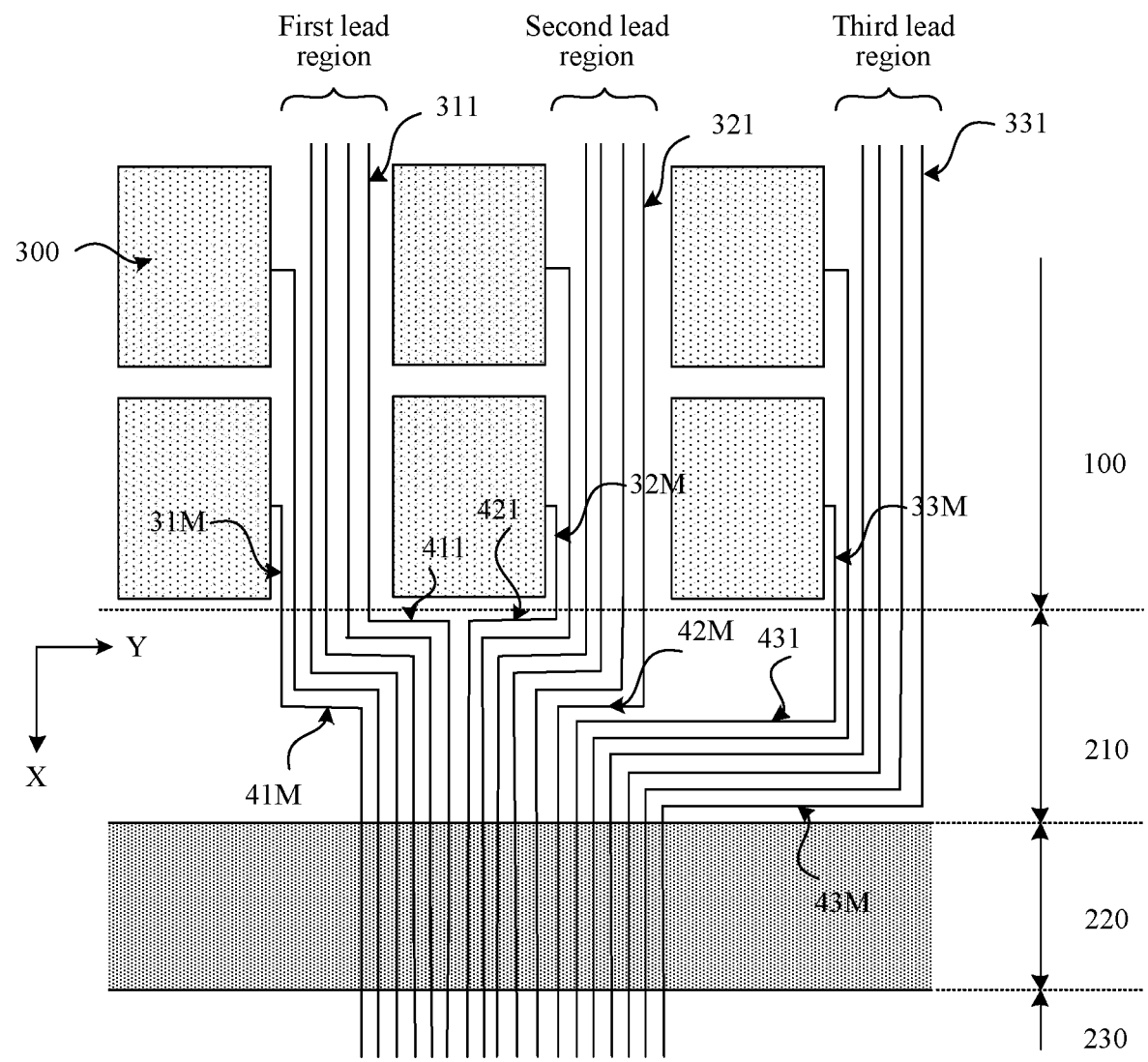
FIG. 3 is a schematic diagram of another lead convergence region according to an exemplary embodiment of the present disclosure.

FIG. 3 is a schematic diagram of another lead convergence region according to an exemplary embodiment of the present disclosure. A fold line structure of the lead convergence region is illustrated by taking the first lead convergence region as an example. In the exemplary embodiment, the touch region 100 may include n2 touch sub-regions, wherein the n2 touch sub-regions are disposed at intervals along the second direction Y. At least one touch sub-region includes three electrode regions 110 and three lead regions 120, i.e., 3M touch electrodes and 3M touch traces. First ends of the 3M touch trace are connected respectively to the 3M touch electrodes, and second ends of the 3M touch traces extend to the trace lead-out region 210. In an exemplary embodiment, the trace lead-out region 210 includes n2 lead convergence regions, wherein the n2 lead convergence regions are disposed at intervals along the second direction Y. At least one lead convergence region is configured to converge the 3M touch traces in the three lead regions 120 in a corresponding touch sub-region, which are connected respectively to multiple connecting lines arranged in the bending region 220, where n2=⌊N/3⌋.

In an exemplary embodiment, in the first direction X, positions of the n2 lead convergence regions 211 correspond to positions of the n2 touch sub-regions in one-to-one correspondence, and the i-th lead convergence region does not overlap with other touch sub-regions except the i-th touch sub-region, or other lead convergence regions except the i-th lead convergence region do not overlap with the i-th touch sub-region, where i=1, 2, . . . , n2.

In an exemplary embodiment, the first touch sub-region includes a first electrode region, a first lead region, a second electrode region, a second lead region, a third electrode region and a third lead region. In the first direction X, the first touch sub-region only overlaps with the first lead convergence region, and the first touch sub-region does not overlap with any of the second, third, . . . , n2-th lead convergence regions. Or, in the first direction X, the first lead convergence region only overlaps with the first touch sub-region, and the first lead convergence region does not overlap with any of the second, third, . . . , n2-th touch sub-regions.

In an exemplary embodiment, at least one lead convergence region may converge the touch traces of the three lead regions. For example, the first lead convergence region may converge touch traces in the first, second and third lead regions, and the second lead convergence region may converge leads in the fourth, fifth and sixth lead regions.

In an exemplary embodiment, the trace lead-out region 210 has a center line extending along the first direction X. Convergence directions of the fold lines in the n2 lead convergence regions in the trace lead-out region 210 are asymmetric with respect to the center line of the trace lead-out region 210.

In an exemplary embodiment, three lead groups may be included in at least one lead convergence region. A first lead group includes M first fold lines arranged sequentially, and each of a second lead group and a third lead group includes M second fold lines arranged sequentially. First ends of the M first fold lines of the first lead group are connected respectively to M touch traces in one lead region, and their second ends bend towards the second direction Y (right side) in the horizontal direction, extend towards the first direction (lower side) in the vertical direction, and are connected respectively to M connecting lines in the bending region 220 after extending to the bending region 220. First ends of the M second fold lines of the second lead group and the M second fold lines of the third lead group are connected respectively to 2M touch traces in two lead regions, and their second ends bend towards the opposite direction (left side) of the second direction Y in the horizontal direction, extend towards the first direction (lower side) in the vertical direction, and are connected respectively to 2M connecting lines in the bending region 220 after extending to the bending region 220. In an exemplary embodiment, the M first fold lines of the first lead group and the M second fold lines of the second lead group may be mirror-symmetric with respect to the center line of the first lead region and the second lead region.

In an exemplary embodiment, at least one first fold line of the M first fold lines included in the first lead group includes at least a first lead-out line, a first turning line and a first extension line connected sequentially, and at least one second fold line of the 2M second fold lines included in the second lead group and the third lead group includes at least a second lead-out line, a second turning line and a second extension line connected sequentially. In an exemplary embodiment, structures of the lead-out lines, turning lines and extending lines in the first lead group and the second lead group are similar to the structures shown in FIG. 2. In an exemplary embodiment, a first end of a second lead-out line in the third lead group is connected to one touch trace in one lead region, a second end of the second lead-out line is connected to a first end of the second turning line after extending towards the first direction X, a second end of the second turning line is connected to a first end of the second extension line after extending towards the opposite direction of the second direction Y, and a second end of the second extension line is connected to one connecting line in the bending region 220 after extending towards the first direction X to reach the bending region 220. Thus, the second lead-out line, the second turning line and the second extension line connected sequentially in the third lead group form a fold line with two fold angles, with the first end of the second lead-out line serving as a first end of the second fold line and the second end of the second extension line serving as a second end of the second fold line, so that the M touch traces in the lead region converge to the lead convergence region.

As shown in FIG. 3, for the M touch traces in the third lead region, a touch trace 33M connected to a touch electrode 300 in the M-th row in the third electrode region extends to the trace lead-out region 210 along the first direction X, and then is connected to a second fold line 431 in the third lead group, . . . , a touch trace 331 connected to a touch electrode 300 in the first row in the third electrode region extends to the trace lead-out region 210 along the first direction X, and then is connected to a second fold line 43M in the third lead group. Since the extension direction of the first turning lines in the first lead group is opposite to the extension direction of the second turning lines in the second lead group, the first turning lines and the second turning lines can be arranged in parallel in the horizontal direction. A distance between a first turning line of the first fold line 411 and the touch region 100 may be equal to a distance between a second turning line of the second fold line 421 and the touch region 100, and a distance between a first turning line of the first fold line 41M and the touch region 100 may be equal to the distance between a second turning line of the second fold line 42M and the touch region 100. Since the extension direction of the second turning lines in the third lead group is same as the extension direction of the second turning lines in the second lead group, the second turning lines in the two lead groups need to be arranged in parallel in the vertical direction. A distance between a second turning line of the second fold line 431 and the touch region 100 is greater than a distance between the second turning line of the second fold line 42M and the touch region 100. Thus, 2M turning lines extending along the horizontal direction in the second lead group and the third lead group need to be arranged in the first direction X in the lead convergence region.

Figure 4:
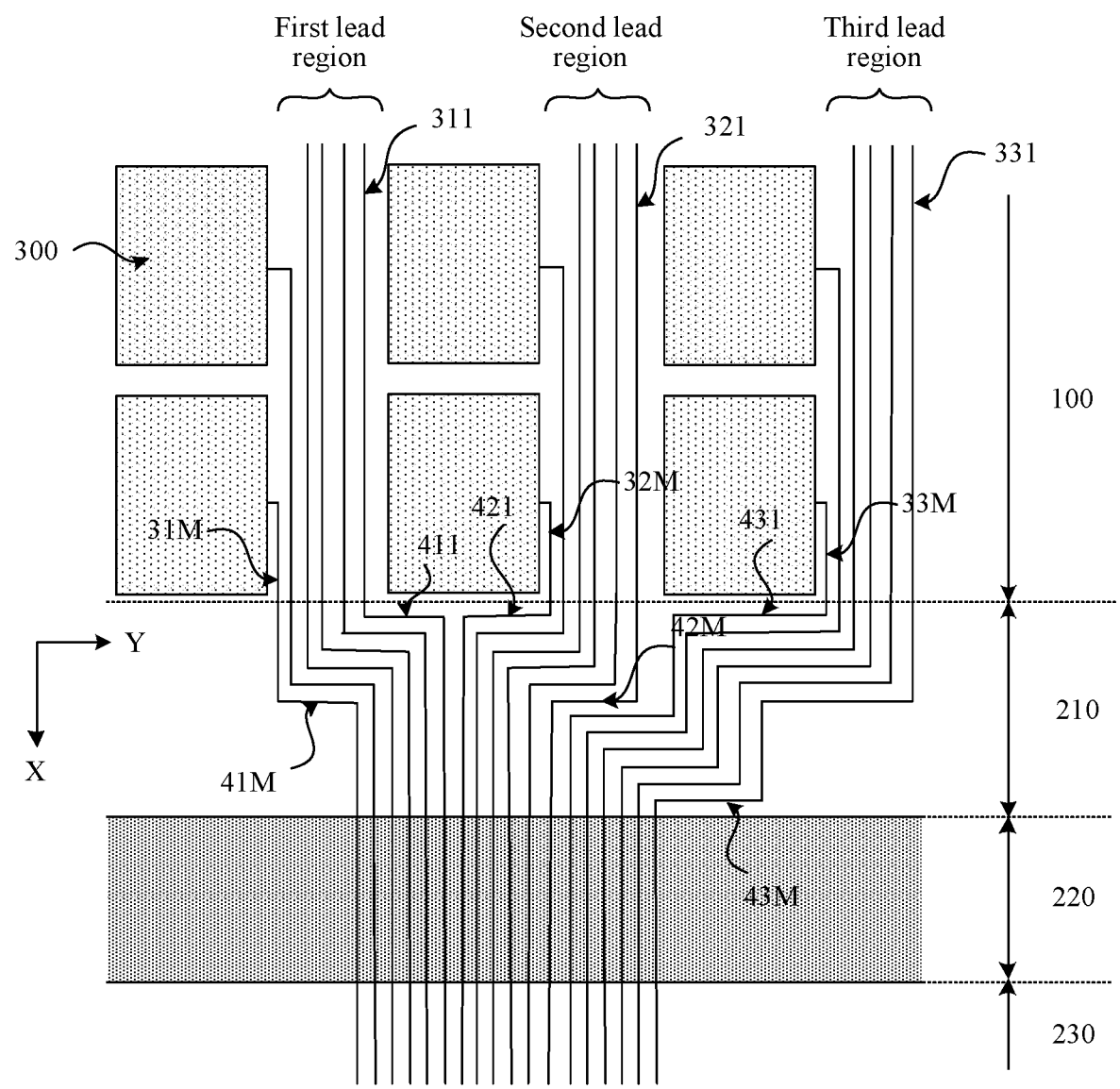
FIG. 4 is a schematic diagram of another lead convergence region according to an exemplary embodiment of the present disclosure.

FIG. 4 is a schematic diagram of another lead convergence region according to an exemplary embodiment of the present disclosure. A fold line structure of the lead convergence region is illustrated by taking the first lead convergence region as an example. In the exemplary embodiment, the touch region 100 may include n2 touch sub-regions, wherein the n2 touch sub-regions are disposed at intervals along the second direction Y. At least one touch sub-region includes three electrode regions 110 and three lead regions 120, i.e., 3M touch electrodes and 3M touch traces. First ends of the 3M touch trace are connected respectively to the 3M touch electrodes, and second ends of the 3M touch traces extend to the trace lead-out region 210. In an exemplary embodiment, the trace lead-out region 210 includes n2 lead convergence regions, wherein the n2 lead convergence regions are disposed at intervals along the second direction Y. At least one lead convergence region is configured to converge the 3M touch traces in the three adjacent lead regions 120 in the touch region 100, which are connected respectively to multiple connecting lines arranged in the bending region 220, where n2=$\lfloor N/3 \rfloor$.

In an exemplary embodiment, three lead groups may be included in at least one lead convergence region. Structures of the lead-out lines, turning lines and extension lines in the first lead group and the second lead group may be similar to the structures shown in FIGS. 2 and 3, while a structure of the third lead group is different from the structure shown in FIG. 3. In an exemplary embodiment, at least one second fold line of the M second fold lines included in the third lead group includes at least a second lead-out line, a first sub-turning line, a second sub-turning line, a third sub-turning line and a second extension line. A first end of the second lead-out line is connected to one touch trace in the third lead region, a second end of the second lead-out line is connected to a first end of the first sub-turning line after extending towards the first direction X, a second end of the first sub-turning line is connected to a first end of the second sub-turning line after extending towards the opposite direction of the second direction Y, a second end of the second sub-turning line is connected to a first end of the third sub-turning line after extending towards the first direction X, a second end of the third sub-turning line is connected to a first end of the second extension line after extending towards the opposite direction of the second direction Y, and a second end of the second extension line is connected to one connecting line in the bending region 220 after extending towards the first direction X to reach the bending region 220. Thus, the second lead-out line, the first sub-turning line, the second sub-turning line, the third sub-turning line and the second extension line connected sequentially in the third lead group form a fold line with four fold angles. The first turning line of the first fold line, the second turning line and the first sub-turning line of the second fold line are arranged in parallel in the horizontal direction, and the second sub-turning line and the third sub-turning line are arranged in parallel in the vertical direction.

As shown in FIGS. 3 and 4, in an exemplary embodiment of the present disclosure, by dividing the trace lead-out region into $\lfloor N/3 \rfloor$ lead convergence regions, at least one lead convergence region includes multiple first fold lines bending towards the second direction Y and multiple second fold lines bending towards the opposite direction of the second direction Y. Only two groups of fold lines are arranged in parallel in the vertical direction, thus the space utilization rate of the multiple turning lines is increased, and the width occupied by the multiple turning lines in the trace lead-out region is reduced, facilitating the implementation of a narrow bezel.

In an exemplary embodiment, three lead groups may be included in at least one lead convergence region. Each of the first lead group and the second lead group includes M first fold lines arranged sequentially, and the third lead group includes M second fold lines arranged sequentially.

Figure 5:
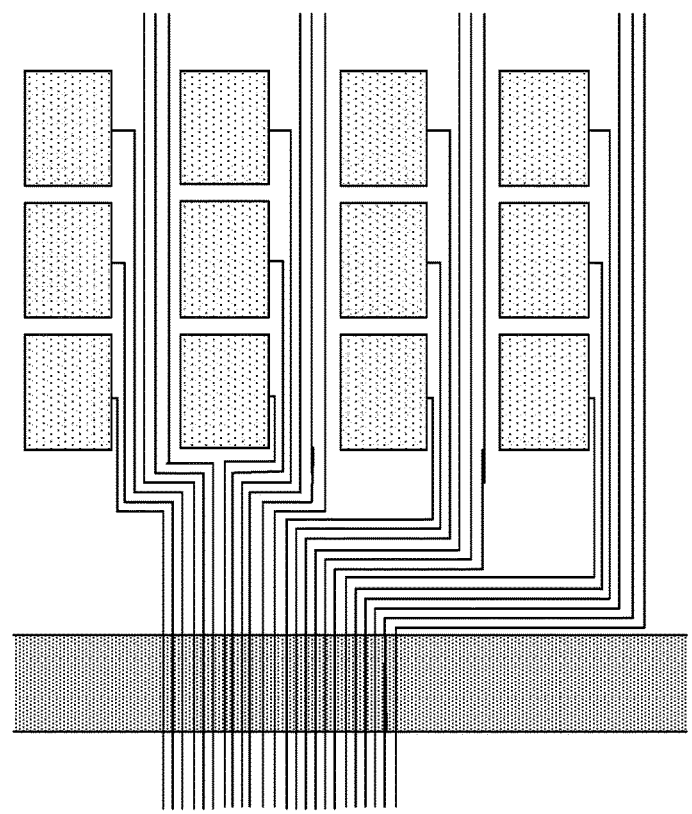
FIGS. 5 and 6 are schematic diagrams of another lead convergence region according to an exemplary embodiment of the present disclosure.
Figure 6:
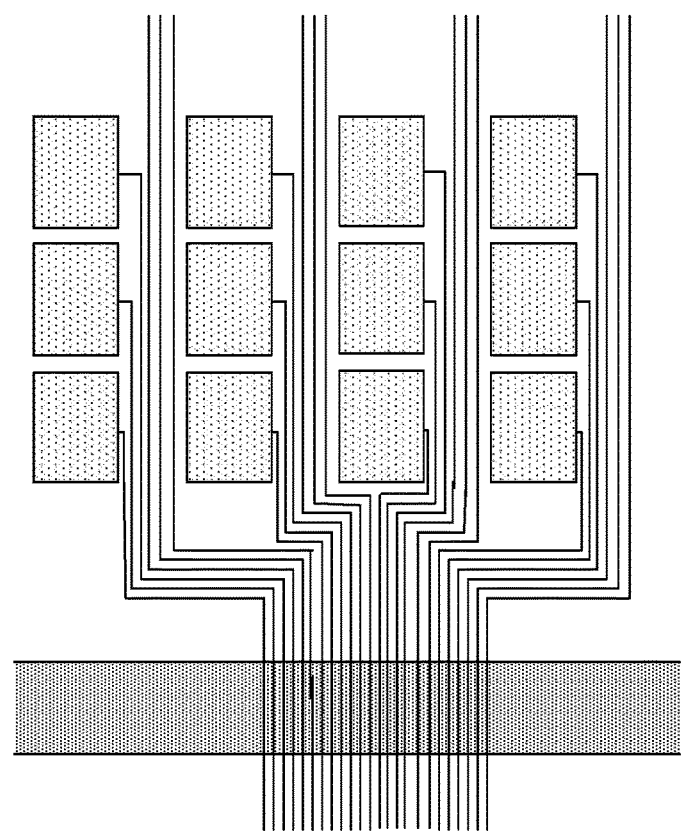

FIGS. 5 and 6 are schematic diagrams of another lead convergence region according to an exemplary embodiment of the present disclosure. A fold line structure of the lead convergence region is illustrated by taking the first lead convergence region as an example. In the exemplary embodiment, the touch region 100 may include n3 touch sub-regions, wherein the n3 touch sub-regions are disposed at intervals along the second direction Y. At least one touch sub-region includes four electrode regions 110 and four lead regions 120, i.e., 4M touch electrodes and 4M touch traces. First ends of the 4M touch traces are connected respectively to the 4M touch electrodes, and second ends of the 4M touch traces extend to the trace lead-out region 210. In an exemplary embodiment, the trace lead-out region 210 includes n3 lead convergence regions, wherein the n3 lead convergence regions are disposed at intervals along the second direction Y. At least one lead convergence region is configured to converge the 4M touch traces in four adjacent lead regions in the touch region 100, which are connected respectively to multiple connecting lines arranged in the bending region 220, where n3=$\lfloor N/4 \rfloor$.

In an exemplary embodiment, in the first direction X, positions of the n3 lead convergence regions 211 correspond to positions of the n3 touch sub-regions in one-to-one correspondence, and the i-th lead convergence region does not overlap with other touch sub-regions except the i-th touch sub-region, or other lead convergence regions except the i-th lead convergence region do not overlap with the i-th touch sub-region, where i=1, 2, . . . , n3.

In an exemplary embodiments, the first touch sub-region includes a first electrode region, a first lead region, a second electrode region, a second lead region, a third electrode region, a third lead region, a fourth electrode region and a fourth lead region. In the first direction X, the first touch sub-region only overlaps with the first lead convergence region, and the first touch sub-region does not overlap with any of the second, third, . . . , n3-th lead convergence regions. Or, in the first direction X, the first lead convergence region only overlaps with the first touch sub-region, and the first lead convergence region does not overlap with any of the second, third, . . . , n3-th touch sub-regions.

In an exemplary embodiment, the trace lead-out region 210 has a center line extending along the first direction X. Convergence directions of the fold lines in the n3 lead convergence regions in the trace lead-out region 210 are asymmetric with respect to the center line of the trace lead-out region 210.

In an exemplary embodiment, four lead groups may be included in at least one lead convergence region. One of the four lead groups uses first fold lines, wherein multiple first fold lines bend towards the second direction and extend to the bending region, and the other three lead groups all use second fold lines, wherein multiple second fold lines bend towards the opposite direction of the second direction and extend to the bending region. Or, two of the four lead groups use the first fold lines, and the other two lead groups use the second fold lines. Or, three of the four lead groups use the first fold lines, and the other lead group uses the second fold lines. Structures of lead-out lines, turning lines and extension lines in each lead group are similar to the structures described above, and will not be described repeatedly herein.

In an exemplary embodiment, the touch region 100 may include n touch sub-regions, wherein the n touch sub-regions are disposed at intervals along the second direction Y. The trace lead-out region 210 may include n lead convergence regions, wherein the n lead convergence regions are disposed at intervals along the second direction Y. In the first direction X, positions of the n lead convergence regions correspond to positions of n2 touch sub-regions in one-to-one correspondence, and the i-th lead convergence region does not overlap with other touch sub-regions except the i-th touch sub-region, or other lead convergence regions except the i-th lead convergence region do not overlap with the i-th touch sub-region, where i=1, 2, . . . , n.

In an exemplary embodiments, the n lead convergence regions may include any one or more of: a lead convergence region with one lead group, a lead convergence region with two lead groups, a lead convergence region with three lead groups, a lead convergence region with four lead groups, a lead convergence region with five lead groups, a lead convergence region with six lead groups and a lead convergence region with seven lead groups.

In an exemplary embodiment, the trace lead-out region has a center line extending along the first direction, and convergence directions of the fold lines in the n lead convergence regions is asymmetric with respect to the center line. In an exemplary embodiment of the present disclosure, the convergence direction of the fold lines is the quantity of the fold lines bending towards the second direction in the lead convergence region or the quantity of the fold lines bending towards the opposite direction of the second direction in the lead convergence region. In an exemplary embodiment, the asymmetry of the convergence directions of the fold lines in the n lead convergence regions includes any one or more of the following cases: a quantity of fold lines bending towards the second direction Y in the first lead convergence region is different from a quantity of fold lines bending towards the second direction Y in the n-th lead convergence region; a quantity of fold lines bending towards the second direction Y in the second lead convergence region is different from a quantity of fold lines bending towards the second direction Y in the (n−1)-th lead convergence region; a quantity of the fold lines bending towards the second direction Y in the third lead convergence region is different from a quantity of fold lines bending towards the second direction Y in the (n−2)-th lead convergence region; a quantity of fold lines bending towards the opposite direction of the second direction Y in the first lead convergence region is different from a quantity of fold lines bending towards the opposite direction of the second direction Y in the n-th lead convergence region; a quantity of fold lines bending towards the opposite direction of the second direction Y in the second lead convergence region is different from a quantity of fold lines bending towards the opposite direction of the second direction Y in the (n−1)-th lead convergence region; or a quantity of fold lines bending towards the opposite direction of the second direction Y in the third lead convergence region is different from a quantity of fold lines bending towards the opposite direction of the second direction Y in the (n−2)-th lead convergence region.

In an exemplary embodiment, the touch panel includes touch electrodes arranged in a matrix of 22 rows*16 columns. The touch region 100 includes 5 touch sub-regions, and the trace lead-out region 210 includes 5 lead convergence regions, namely, M=22, N=16, and n=5.

Figure 7:
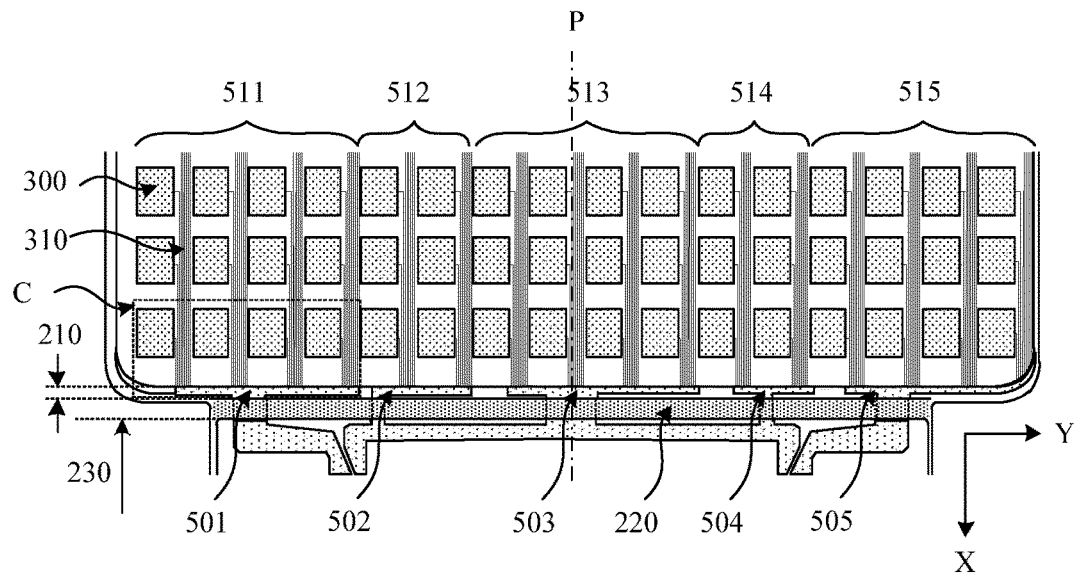
FIG. 7 is a schematic diagram of a trace lead-out region according to an exemplary embodiment of the present disclosure.

FIG. 7 is a schematic diagram of a trace lead-out region according to an exemplary embodiment of the present disclosure. As shown in FIG. 7, in an exemplary embodiment, the touch region includes 22*16 touch electrodes 300 arranged in a matrix to form 16 electrode regions and 16 lead regions, wherein each electrode region includes 22 touch electrodes 300 and each lead region includes 22 touch traces 310. The touch region 100 includes five touch sub-regions, and the trace lead-out region 210 includes five lead convergence regions. The five touch sub-regions include a first touch sub-region 511, a second touch sub-region 512, a third touch sub-region 513, a fourth touch sub-region 514 and a fifth touch sub-region 515 disposed sequentially along the second direction Y. The five lead convergence regions include a first lead convergence region 501, a second lead convergence region 502, a third lead convergence region 503, a fourth lead convergence region 504 and a fifth lead convergence region 505 disposed sequentially along the second direction Y. First ends of multiple touch traces in the first touch sub-region 511 are connected respectively to multiple touch electrodes in the first touch sub-region 511, and second ends of the multiple touch traces extend to the first lead convergence region 501. First ends of multiple touch traces in the second touch sub-region 512 are connected respectively to multiple touch electrodes in the second touch sub-region 512, and second ends of the multiple touch traces extend to the second lead convergence region 502. First ends of multiple touch traces in the third touch sub-region 513 are connected respectively to multiple touch electrodes in the third touch sub-region 513, and second ends of the multiple touch traces extend to the third lead convergence region 503. First ends of multiple touch traces in the fourth touch sub-region 514 are connected respectively to multiple touch electrodes in the fourth touch sub-region 514, and second ends of the multiple touch traces extend to the fourth lead convergence region 504. First ends of multiple touch traces in the fifth touch sub-region 515 are connected respectively to multiple touch electrodes in the fifth touch sub-region 515, and second ends of the multiple touch traces extend to the fifth lead convergence region 505.

In an exemplary embodiment, the trace lead-out region 210 has a center line P extending along the first direction. Convergence directions of the fold lines in the five lead convergence regions are asymmetric with respect to the center line P, that is, a quantity of fold lines bending towards the second direction Y in the first lead convergence region 501 is different from a quantity of fold lines bending towards the second direction Y in the fifth lead convergence region 505, or a quantity of fold lines bending towards the second direction Y in the second lead convergence region 502 is different from a quantity of fold lines bending towards the second direction Y in the fourth lead convergence region 504.

In an exemplary embodiment, the first touch sub-region 511 includes four electrode regions and four lead regions, the second touch sub-region 512 includes two electrode regions and two lead regions, the third touch sub-region 513 includes four electrode regions and four lead regions, the fourth touch sub-region 514 includes two electrode regions and two lead regions, and the fifth touch sub-region 515 includes four electrode regions and four lead regions. The first lead convergence region 501 includes four lead groups, the second lead convergence region 502 includes two lead groups, the third lead convergence region 503 includes four lead groups, the fourth lead convergence region 504 includes two lead groups, and the fifth lead convergence region 505 includes four lead groups. The first lead convergence region 501 is configured to converge 4M touch traces in the four lead regions in the first touch sub-region 511, the second lead convergence region 502 is configured to converge 2M touch traces in the two lead regions in the second touch sub-region 512, the third lead convergence region 503 is configured to converge 4M touch traces in the four lead regions in the third touch sub-region 513, the fourth lead convergence region 504 is configured to converge 2M touch traces in the two lead regions in the fourth touch sub-region 514, and the fifth lead convergence region 505 is configured to converge 4M touch traces in the four lead regions in the fifth touch sub-region 515.

In an exemplary embodiment, in the first direction X, the first lead convergence region 501 overlaps with the first touch sub-region 511, but it does not overlap with any of the second touch sub-region 512, the third touch sub-region 513, the fourth touch sub-region 514 and the fifth touch sub-region 515; the second lead convergence region 502 overlaps with the second touch sub-region 512, but it does not overlap with any of the first touch sub-region 511, the third touch sub-region 513, the fourth touch sub-region 514 and the fifth touch sub-region 515; the third lead convergence region 503 overlaps with the third touch sub-region 513, but it does not overlap with any of the first touch sub-region 511, the second touch sub-region 512, the fourth touch sub-region 514 and the fifth touch sub-region 515; the fourth lead convergence region 504 overlaps with the fourth touch sub-region 514, but it does not overlap with any of the first touch sub-region 511, the second touch sub-region 512, the third touch sub-region 513 and the fifth touch sub-region 515; and the fifth lead convergence region 505 overlaps with the fifth touch sub-region 515, but it does not overlap with any of the first touch sub-region 511, the second touch sub-region 512, the third touch sub-region 513 and the fourth touch sub-region 514.

In an exemplary embodiment, in the first direction X, the first touch sub-region 511 overlaps with the first lead convergence region 501, but it does not overlap with any of the second lead convergence region 502, the third lead convergence region 503, the fourth lead convergence region 504 and the fifth lead convergence region 505; the second touch sub-region 512 overlaps with the second lead convergence region 502, but it does not overlap with any of the first lead convergence region 501, the third lead convergence region 503, the fourth lead convergence region 504 and the fifth lead convergence region 505; the third touch sub-region 513 overlaps with the third lead convergence region 503, but it does not overlap with any of the first lead convergence region 501, the second lead convergence region 502, the fourth lead convergence region 504 and the fifth lead convergence region 505; the fourth touch sub-region 514 overlaps with the fourth lead convergence region 504, but it does not overlap with any of the first lead convergence region 501, the second lead convergence region 502, the third lead convergence region 503 and the fifth lead convergence region 505; and the fifth touch sub-region 515 overlaps with the fifth lead convergence region 505, but it does not overlap with any of the first lead convergence region 501, the second lead convergence region 502, the third lead convergence region 503 and the fourth lead convergence region 504.

In an exemplary embodiment, among the four lead groups included in the first lead convergence region 501, two lead groups on the left use first fold lines bending towards the right (the second direction Y), and two lead groups on the right use second fold lines bending towards the left (the opposite direction of the second direction Y). Both the two lead groups included in the second lead convergence region 502 use the second fold lines bending towards the left (the opposite direction of the second direction Y). Among the four lead groups included in the third lead convergence region 503, one lead group on the left uses first fold lines bending towards the right (the second direction Y), and the other three lead groups all use second fold lines bending towards the left (the opposite direction of the second direction Y). Among the two lead groups included in the fourth lead convergence region 504, one lead group on the left uses first fold lines bending towards the right (the second direction Y), and the other lead group on the right uses second fold lines bending towards the left (the opposite direction of the second direction Y). Among the four lead groups included in the fifth lead convergence region 505, one lead group on the left uses first fold lines bending towards the right (the second direction Y), and the other three lead groups all use second fold lines bending towards the left (the opposite direction of the second direction Y). Thus, the quantity of the fold lines bending towards the right in the first lead convergence region 501 is 44, the quantity of the fold lines bending towards the right in the second lead convergence region 502 is 0, the quantity of the fold lines bending towards the right in the third lead convergence region 503 is 22, the quantity of the fold lines bending towards the right in the fourth lead convergence region 504 is 22, and the quantity of the fold lines bending towards the right in the fifth lead gathering region 505 is 22. The quantity of the fold lines bending towards the right in the first lead convergence region 501 is different from the quantity of the fold lines bending towards the right in the fifth lead convergence region 505, then the fold lines bending towards the right in the first lead convergence region and the fold lines bending towards the right in the fifth lead convergence region are asymmetric with respect to the center line P. The quantity of the fold lines bending towards the right in the second lead convergence region 502 is different from the quantity of the fold lines bending towards the right in the fourth lead convergence region 504, then the fold lines bending towards the right in the second lead convergence region and the fold lines bending towards the right in the fourth lead convergence region are asymmetric with respect to the center line P.

In an exemplary embodiment, the bending region includes five connecting line convergence regions disposed at intervals along the second direction Y, and the circuit region 230 includes two output line convergence regions and two multiplexer circuits (not shown).

In an exemplary embodiment, a position of a first connecting line convergence region corresponds to a position of the first lead convergence region 501 in the trace lead-out region 210, wherein the first connecting line convergence region include 4M connecting lines. First ends of the 4M connecting lines are connected respectively to second ends of 4M fold lines in the first lead convergence region 501, and second ends of the 4M connecting lines are connected to a first multiplexer circuit through 4M output lines in a first output line convergence region.

In an exemplary embodiment, a position of the second connecting line convergence region corresponds to a position of the second lead convergence region 502 in the trace lead-out region 210, wherein the second connecting line convergence region include 2M connecting lines. First ends of the 2M connecting lines are connected respectively to second ends of 2M fold lines in the second lead convergence region 502, and second ends of the 2M connecting lines are connected to the first multiplexer circuit through 2M output lines in the first output line convergence region.

In an exemplary embodiment, a position of the third connecting line convergence region corresponds to a position of the third lead convergence region 503 in the trace lead-out region 210, wherein the third connecting line convergence region include 4M connecting lines. First ends of the 4M connecting lines are connected respectively to second ends of 4M fold lines in the third leading line convergence region 503, second ends of MM1 connecting lines of the 4M connecting lines are connected to the first multiplexer circuit through MM1 output lines in the first output line convergence region, and second ends of MM2 connecting lines of the 4M connecting lines are connected to a second multiplexer circuit through MM2 output lines in the second output line convergence region, where MM1+MM2=4M. In the exemplary embodiment, MM1 and MM2 may both be equal to 2M, or MM1 may be equal to M and MM2 may be equal to 3M, which is not limited in the present disclosure.

In an exemplary embodiment, a position of the fourth connecting line convergence region corresponds to a position of the fourth lead convergence region 504 in the trace lead-out region 210, wherein the fourth connecting line convergence region includes 2M connecting lines. First ends of the 2M connecting lines are connected respectively to second ends of 2M fold lines in the fourth leading line convergence region 504, and second ends of the 2M connecting lines are connected to the second multiplexer circuit through 2M output lines in the second output line convergence region.

In an exemplary embodiment, a position of the fifth connecting line convergence region corresponds to a position of the fifth lead convergence region 505 in the trace lead-out region 210, wherein the fifth connecting line convergence region includes 4M connecting lines. First ends of the 4M connecting lines are connected respectively to second ends of 4M fold lines in the fifth leading line convergence region 505, and second ends of the 4M connecting lines are connected to the second multiplexer circuit through 4M output lines in the second output line convergence region.

In an exemplary embodiment, first ends of multiple output lines in the first output line convergence region may be connected respectively to second ends of multiple connecting lines in the first, second and third connecting line convergence regions, and second ends of the multiple output lines in the first output line convergence region are connected to the first multiplexer circuit. First ends of multiple output lines in the second output line convergence region may be connected respectively to second ends of multiple connecting lines in the fourth and fifth connecting line convergence regions, and second ends of the multiple output lines in the second output line convergence region are connected to the second multiplexer circuit.

In an exemplary embodiment, first ends of the multiple output lines in the first output line convergence region may be connected respectively to second ends of the multiple connecting lines in the first and second connecting line convergence regions, and the second ends of the multiple output lines in the first output line convergence region are connected to the first multiplexer circuit. First ends of the multiple output lines in the second output line convergence region may be connected respectively to the second ends of the multiple connecting lines in the third, fourth and fifth connecting line convergence regions, and second ends of the multiple output lines in the second output line convergence region are connected to the second multiplexer circuit.

Figure 8:
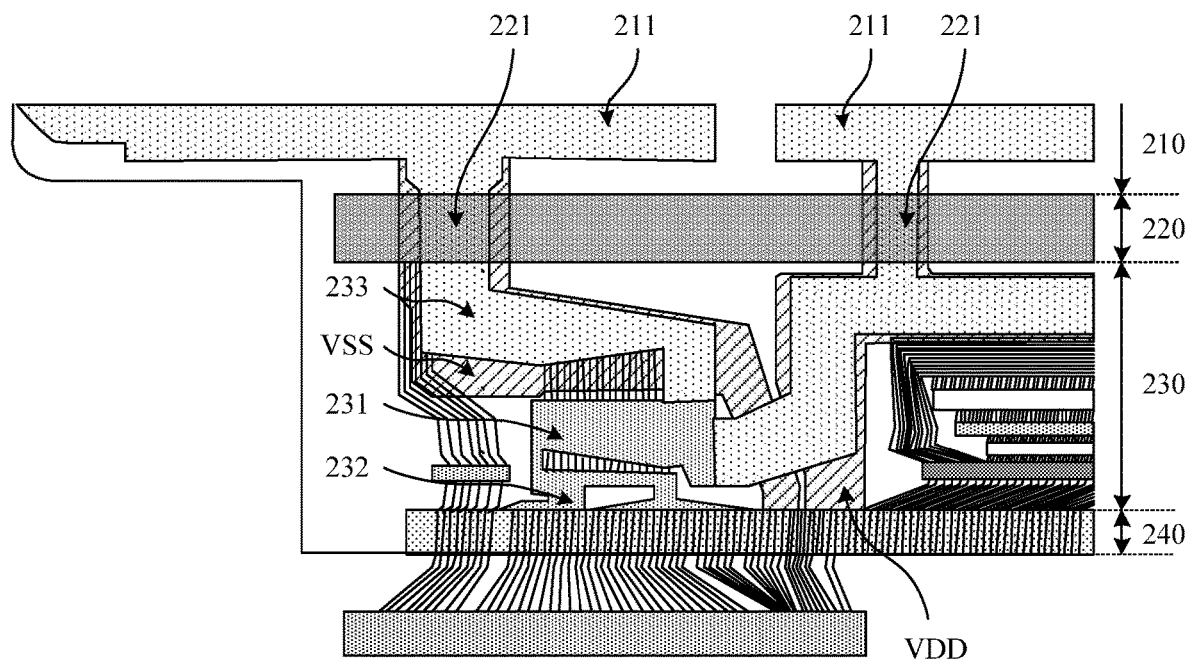
FIG. 8 is a schematic diagram of an output line convergence region according to an exemplary embodiment of the present disclosure.

FIG. 8 is a schematic diagram of an output line convergence region according to an exemplary embodiment of the present disclosure. In the exemplary embodiment, the circuit region 230 may include two multiplexer circuits 231, multiple input lines 232 and multiple output lines 233. FIG. 8 illustrates one output line convergence region and one multiplexer circuit on the left of the binding region. As shown in FIG. 8, the trace lead-out region 210 includes multiple lead convergence regions 211, the bending region 220 includes multiple connecting line convergence regions 221, and the circuit region 230 includes the multiplexer circuit 231 and the output line convergence region. Multiple connecting lines in the connecting line convergence regions 221 are connected respectively to multiple fold lines in the lead convergence regions 211, first ends of the multiple output lines 233 in the output line convergence region are connected respectively to the multiple connecting lines in the connecting line convergence region 221, and second ends of the multiple output lines 233 are connected respectively to multiple output ports of the multiplexer circuit 231. The circuit region 230 further includes multiple input lines 232. First ends of the multiple input lines 232 are connected respectively to multiple input ports of the multiplexer circuit 231, and second ends of the multiple input lines 232 are connected respectively to multiple pins of the binding pin region 240.

In an exemplary embodiment, a touch panel in a form of a flexible multi layer on cell structure is disposed on an OLED display substrate, and a first power supply line VDD and a second power supply line VSS are disposed on the display substrate in regions where the trace lead-out region, the bending region and the circuit region are located. In the exemplary embodiment, in the region where the trace lead-out region 210 is located, a position of the first power supply lines VDD or the second power supply lines VSS corresponds to positions of the multiple lead convergence regions 211, that is, an orthogonal projection of the first power supply line VDD or the second power supply line VSS on the base substrate overlaps with an orthogonal projection of the lead convergence regions 211 on the base substrate. In a region where the bending region 220 is located, a position of the first power supply line VDD or the second power supply line VSS corresponds to positions of the multiple connecting line convergence regions 221, that is, the orthogonal projection of the first power supply line VDD or the second power supply line VSS on the base substrate overlaps with an orthogonal projections of the connecting line convergence regions 221 on the base substrate. In a region where the circuit region 230 is located, a position of the first power supply line VDD or the second power supply line VSS corresponds to positions of the output line convergence regions, that is, the orthogonal projection of the first power supply line VDD or the second power supply line VSS on the base substrate overlaps with an orthogonal projections of the output line convergence regions on the base substrate. The first power supply line VDD or the second power supply line VSS provides shielding function for signal lines in the lead convergence regions 211, the connecting line convergence regions 221 and the output line convergence regions, thereby preventing other data transmission lines from interfering with transmission of touch signals and improving the reliability of the signal transmission.

Figure 9:
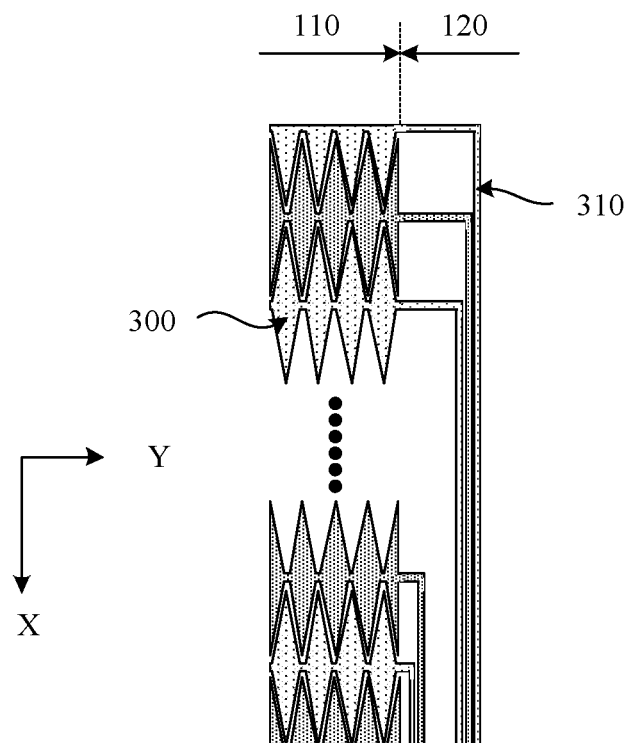
FIG. 9 is a schematic diagram of an electrode region and a lead region in a touch panel.

FIG. 9 is a schematic diagram of an electrode region and a lead region in a touch panel. As shown in FIG. 9, in an exemplary embodiment, the electrode region 110 includes multiple touch electrodes 300 disposed at intervals along the first direction X, wherein each touch electrode 300 includes multiple sub-electrodes and multiple connecting portions. The sub-electrodes are rhombic and the connecting portions are rectangular, and the multiple sub-electrodes and the multiple connecting portions are arranged alternately and connected sequentially along the second direction Y to form the rack-shaped touch electrodes 300. The multiple rack-shaped touch electrodes 300 are arranged sequentially along the first direction X. A protrusion of a first touch electrode of two adjacent touch electrodes 300 extends into a groove of a second touch electrode, and a protrusion of the second touch electrode extends into a groove of the first touch electrode, such that the two touch electrodes engage with each other. In an exemplary embodiment, the lead region 120 includes multiple touch traces 310 connected sequentially along the second direction Y. Each touch trace 310 includes a first lead extending along the second direction Y and a second lead extending along the first direction X. A first end of the first lead is connected to a touch electrode 300, and is connected to a first end of the second lead after extending along the second direction Y, and a second end of the second lead extends to the binding region along the first direction X. The multiple touch traces 310 are arranged in a nested form. As a distance between the touch electrodes 300 and the binding region increases, lengths of the first lead and the second lead increase.

Figure 10:
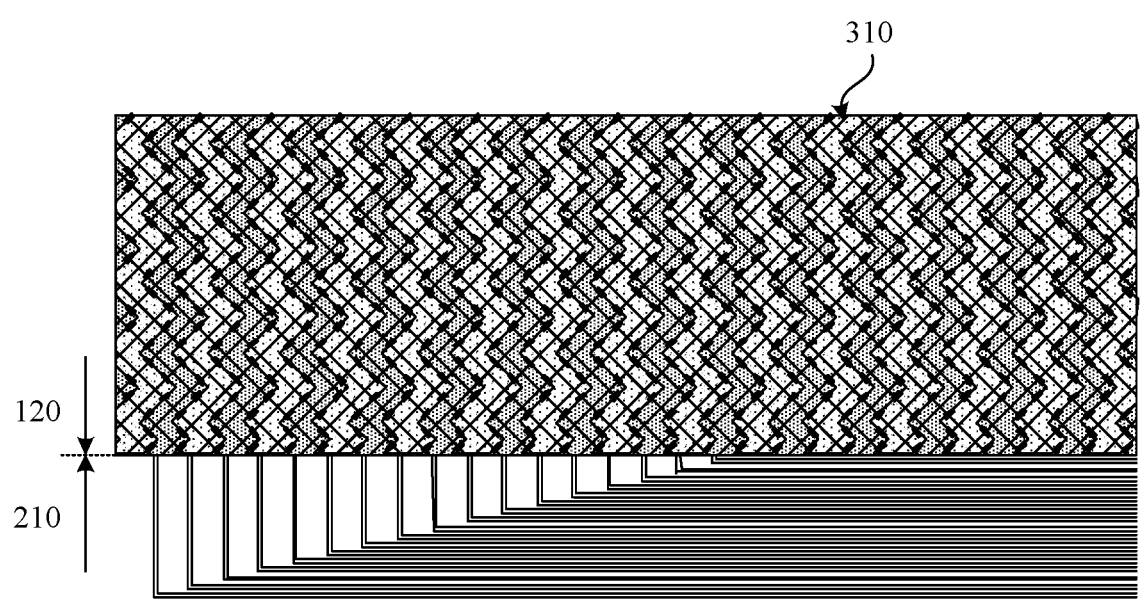
FIG. 10 is a schematic diagram of touch traces in a touch panel.

FIG. 10 is a schematic diagram of touch traces in a touch panel, which illustrates a structure of the touch traces in a interface region between the lead region 120 and the trace lead-out region 210. In an exemplary embodiment, the touch electrodes and the touch traces in the touch region may be arranged in a form of a metal mesh, which is formed by interweaving multiple metal lines. The metal mesh includes multiple, mesh patterns, which are polygons formed by multiple metal lines. The touch electrodes and leads in the form of a metal mesh have advantages, such as low resistance, small thickness, fast response speed, portability and foldability. In the exemplary embodiment, the shape of the mesh pattern formed by the metal lines may include any one or more of a triangle, a square, a rectangle, a rhombus, a trapezoid, a pentagon and a hexagon. In an exemplary embodiment, the mesh pattern is a rhombus. In order to form mutually insulated leads, multiple notches are provided on the metal mesh. The metal lines of the mesh patterns are disconnected by the multiple notches to implement isolation between the mesh patterns of the touch traces and the grid mesh of their adjacent touch traces. The notches may be understood as imaginary lines cutting the metal lines, and the multiple notches on the multiple mesh patterns may form a signal transmission channel. As shown in FIG. 10, black blocks represent the notches and dark and light filled parts represent touch traces 310 defined by the multiple notches. In an exemplary embodiment, the fold lines in the trace lead-out region 210 may be in a form of metal lines, and multiple metal lines are connected respectively to multiple touch traces 310 in the trace lead-out region 120, and the multiple touch traces 310 are converged together in the manner described above.

Figure 11:
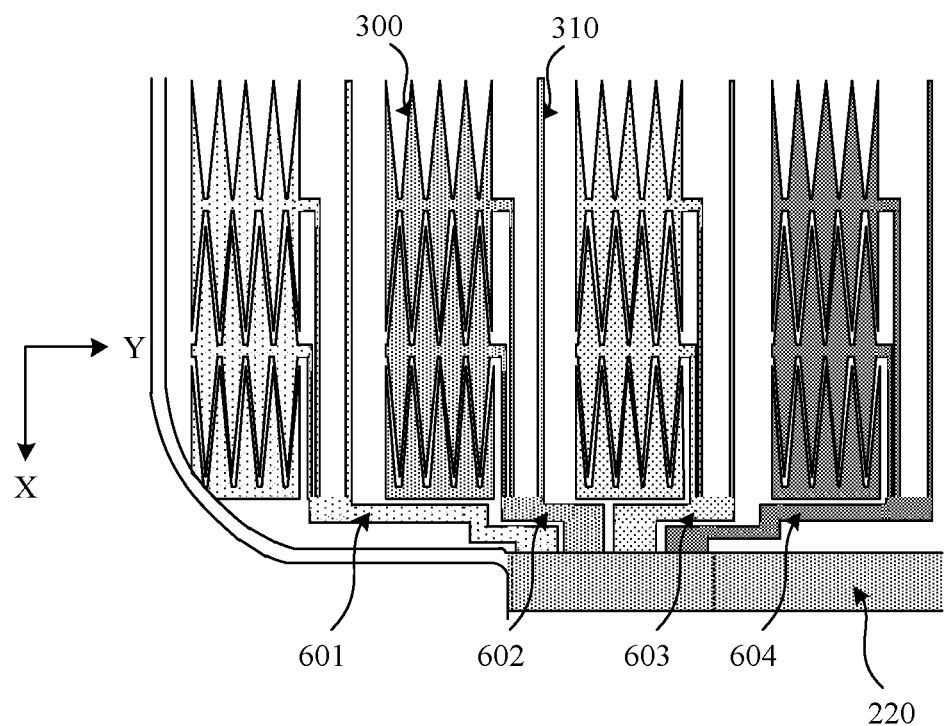
FIG. 11 is a schematic diagram of a first lead convergence region according to an exemplary embodiment of the present disclosure.

FIG. 11 is a schematic diagram of a first lead convergence region according to an exemplary embodiment of the present disclosure, which is an enlarged view of the region C in FIG. 7. As shown in FIG. 11, the first lead convergence region includes four lead groups, which include a first lead group 601, a second lead group 602, a third lead group 603, and a fourth lead group 604 disposed sequentially along the second direction Y. The first lead group 601 includes 22 first fold lines, first ends of the 22 first fold lines are connected respectively to 22 touch traces in the first lead region, and their second ends bend towards the second direction Y (right side) in the horizontal direction, and extend towards the first direction X (lower side) in the vertical direction to reach the bending region 220. The second lead group 602 includes 22 first fold lines, first ends of the 22 first fold lines are connected respectively to 22 touch traces in the second lead region, and their second ends bend towards the second direction Y (right side) in the horizontal direction, and extend towards the first direction X (lower side) in the vertical direction to reach the bending region 220. The third lead group 603 includes 22 second fold lines, first ends of the 22 second fold lines are connected respectively to 22 touch traces in the third lead region, and their second ends bend towards the opposite direction (left side) of the second direction Y in the horizontal direction, and extend towards the first direction X (lower side) in the vertical direction to reach the bending region 220. The fourth lead group 604 includes 22 second fold lines, first ends of the 22 second fold lines are connected respectively to 22 touch traces in the fourth lead region, and their second ends bend towards the opposite direction (left side) of the second direction Y in the horizontal direction, and extend towards the first direction X (lower side) in the vertical direction to reach the bending region 220.

In a touch panel, only two lead convergence regions are disposed in the trace lead-out region along the second direction Y. The two lead convergence regions are located respectively on two sides of the binding region, wherein positions of the two lead convergence regions are arranged to be symmetrical with respect to the center line of the trace lead-out region, and convergence directions of fold lines of the two lead convergence regions is arranged to be symmetrical with respect to the center line of the trace lead-out region. Thus, M*⌊N/2⌋ leads in the first lead region to the ⌊N/2⌋-th lead region in the touch region all need to bend towards the left in the horizontal direction and extend towards the bending region in the vertical direction, while M*N–M*⌊N/2⌋ leads in other lead regions in the touch region all need to bend towards the right in the horizontal direction and extend towards the bending region in the vertical direction. Because M*⌊N/2⌋ fold lines bend in a same direction in the trace lead-out region, fold lines extending in the horizontal direction, among these fold lines, need to be arranged in parallel in the vertical direction, such that the width of the trace lead-out region is larger. For example, for a touch panel including touch electrodes arranged in a matrix of 22 rows*16 columns, the width of the trace lead-out region is about 1.3 mm to 1.8 mm, which is not conducive to the implementation of a narrow bezel.

In an exemplary embodiment of the present disclosure, the trace lead-out region is divided into multiple lead convergence regions. The convergence directions of fold lines in the multiple lead convergence regions are arranged to be asymmetrical with respect to the center line of the trace lead-out region, and at least one lead convergence region includes fold lines bending towards each other, so that turning lines extending in the horizontal direction, of a part of fold lines, can be arranged in parallel in the horizontal direction, and only turning lines extending in the horizontal direction, of a part of fold lines, need to be arranged in parallel in the vertical direction, thereby improving the space utilization rate of the multiple turning lines, decreasing the number of turning lines arranged in parallel in the vertical direction, and reducing the width occupied by the turning lines in the trace lead-out region, such that the bending region can be closer to the touch region, which is conducive to the implementation of a narrow bezel. Simulation researches show that for a touch panel including touch electrodes arranged in a matrix of 22 rows*16 columns, when the trace lead-out region is divided into five lead convergence regions, the width of the trace lead-out region can be reduced to about 0.8 mm to 1.2 mm, thereby effectively reducing the width of the trace lead-out region.

Figure 12:
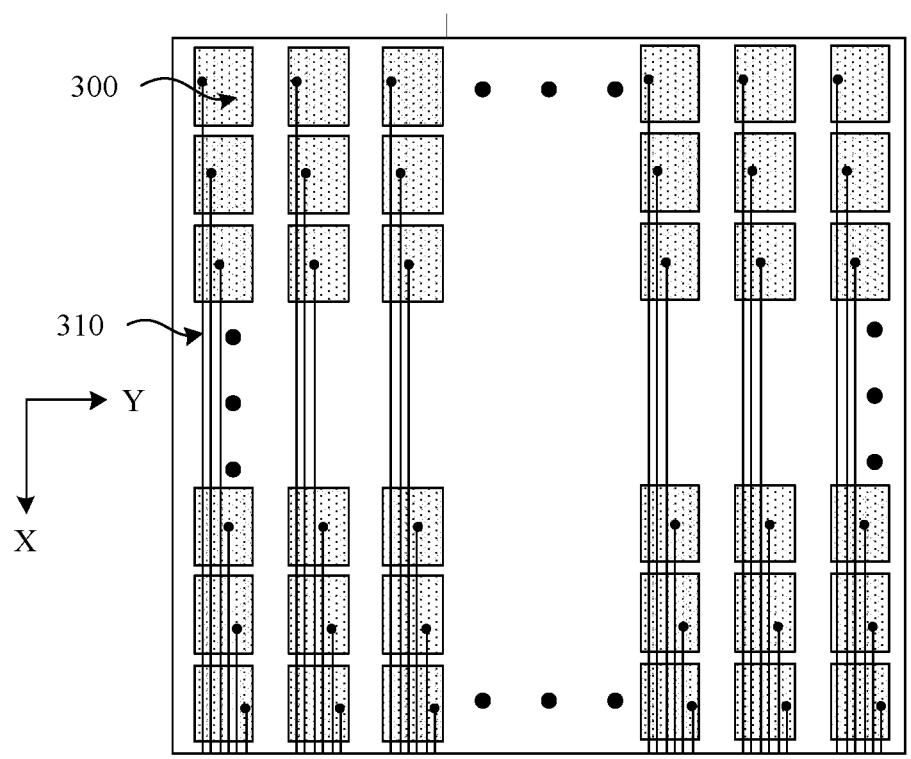
FIG. 12 is a schematic diagram of a structure of a touch region in another touch panel according to an exemplary embodiment of the present disclosure.

FIG. 12 is a schematic diagram of a structure of a touch region in another touch panel according to an exemplary embodiment of the present disclosure, which illustrates a self-capacitance structure. As shown in FIG. 12, in a plane parallel to the touch panel, the touch panel may include multiple touch electrodes 300 arranged regularly. In the exemplary embodiment, the touch region 100 may be divided into multiple composite electrode regions, which are strip-shaped regions extending along the first direction X. The strip-shaped composite electrode regions are disposed sequentially along the second direction Y. Each composite electrode region includes multiple touch electrodes 300 arranged sequentially along the first direction X and multiple touch traces 310 arranged sequentially along the second direction Y. A first end of each touch trace 310 is connected to one touch electrode 300, and its second end extends to the binding region along the first direction X. In an exemplary embodiment, the touch traces 310 are located above or below the touch electrodes 300, that is, an orthogonal projection of the touch traces 310 on the plane of the touch panel are within the range of an orthogonal projection of the touch electrodes 300 on the plane of the touch panel.

In an exemplary embodiment, the binding region may include a trace lead-out region, a bending region, a circuit region and a binding pin region which are disposed sequentially along the first direction X. The trace lead-out region may include multiple lead convergence regions which are disposed at intervals along the second direction Y. Each lead convergence region is configured to converge multiple touch traces of the touch region, which are connected respectively to multiple connecting lines arranged in the bending region 220. In an exemplary embodiment, structures of the trace lead-out region, the bending region and the circuit region may be similar to the structures in the exemplary embodiments described above.

Figure 13:
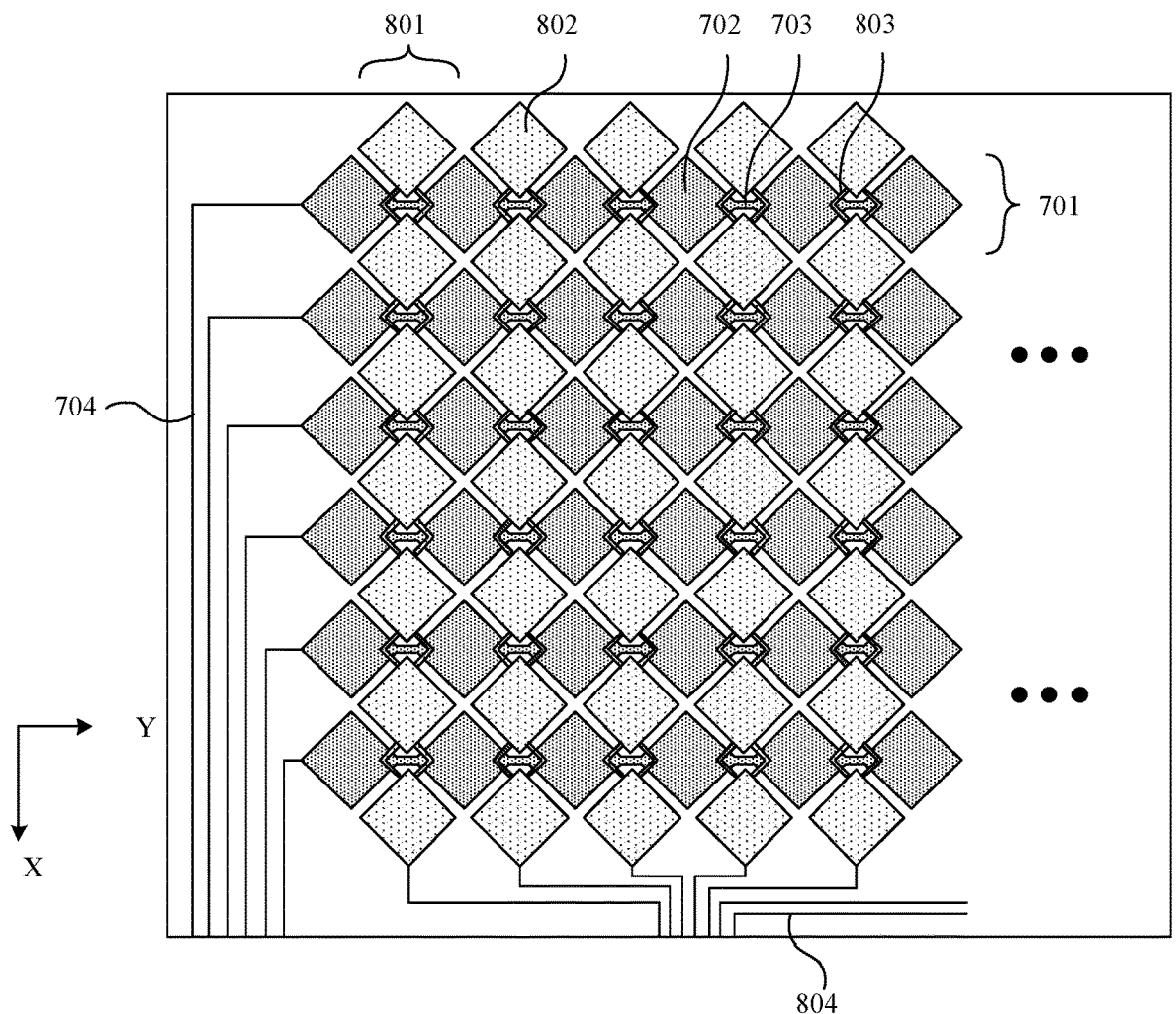
FIG. 13 is a schematic diagram of a structure of a touch region in another touch panel according to an exemplary embodiment of the present disclosure.

FIG. 13 is a schematic diagram of a structure of a touch region in another touch panel according to an exemplary embodiment of the present disclosure, which illustrates a mutual capacitance structure. As shown in FIG. 13, in a plane parallel to the touch panel, the touch region may include multiple first touch units 701 and multiple second touch units 801. Each of the first touch units 701 has a linear shape extending along the second direction Y, and the multiple first touch units 701 are arranged sequentially along the first direction X. Each of the second touch units 801 has a linear shape extending along the second direction X, and the multiple first touch units 801 are arranged sequentially along the second direction Y. Each of the first touch units 701 includes multiple first touch electrodes 702 arranged sequentially along the second direction Y and first connecting portions 703. The first touch electrodes 702 and the first connecting portions 703 are arranged alternately and connected sequentially. Each of the second touch units 801 includes multiple second touch electrodes 802 arranged sequentially along the first direction X. The multiple second touch electrodes 802 are arranged at intervals, and adjacent second touch electrodes 802 are connected to each other via second connecting portions 803. A layer on which the second connecting portions 803 are located is different from layers on which the first touch electrodes 702 and the second touch electrodes 802 are located.

In an exemplary embodiment, each of the first touch units 701 extends to the binding region 200 through a first touch trace 704, wherein the first touch trace 704 is arranged on one side or both sides of the touch region. Each of the second touch units 801 extends to the binding region through a second touch trace 804, wherein the second touch trace 804 is arranged on one side of the touch region adjacent to the binding region 200.

In an exemplary embodiment, the multiple first touch electrodes 702, the multiple second touch electrodes 802 and the multiple first connecting portions 703 may be arranged on the same touch layer and may be formed simultaneously by a same patterning process. The first touch electrodes 702 and the first connecting portions 703 may be interconnected integral structures, and the second connecting portions 803 may be arranged in a bridge layer and interconnect the adjacent second touch electrodes 802 through via holes. An insulating layer is provided between the touch layer and the bridge layer. In some possible implementations, the multiple first touch electrodes 702, the multiple second touch electrodes 802 and the multiple second connecting portions 803 may be arranged in the same touch layer. The second touch electrodes 802 and the second connecting portions 803 may be interconnected integral structures. The first connecting portions 703 may be arranged on a bridge layer and interconnect the adjacent first touch electrodes 702 through via holes. In an exemplary embodiment, the first touch electrodes may be driving electrodes (Tx) and the second touch electrodes may be sensing electrodes (Rx). Or, the first touch electrodes may be sensing electrodes (Rx) and the second touch electrodes may be driving electrodes (Tx).

In an exemplary embodiment, the binding region may include a trace lead-out region, a bending region, a circuit region and a binding pin region which are disposed sequentially along the first direction X. The trace lead-out region may include multiple lead convergence regions disposed at intervals along the second direction Y. Each lead convergence region is configured to converge multiple second touch traces 804 of the touch region, which are connected respectively to multiple connecting lines arranged in the bending region 220. In an exemplary embodiment, structures of the trace lead-out region, the bending region, the circuit region and the binding pin region in the binding region may be similar to the structures in the exemplary embodiments described above.

An exemplary embodiment of the present disclosure further provides a display panel including a display substrate disposed on a base substrate and a touch panel disposed on the display substrate. The display substrate may be a liquid crystal display (LCD) substrate, an organic light emitting diode (OLED) display substrate, a plasma display panel (PDP) display substrate, or an electrophoretic display (EPD) display substrate. In an exemplary embodiment, the display substrate is an OLED display substrate, and the touch panel according to the exemplary embodiment of the present disclosure is disposed on the display substrate to form a flexible multi-layer on cell (FMLOC) structure, which integrates a display structure with a touch structure, and has advantages such as portability and foldability, so as to meet the requirements of products such as flexible folding and narrow bezel.

Figure 14:
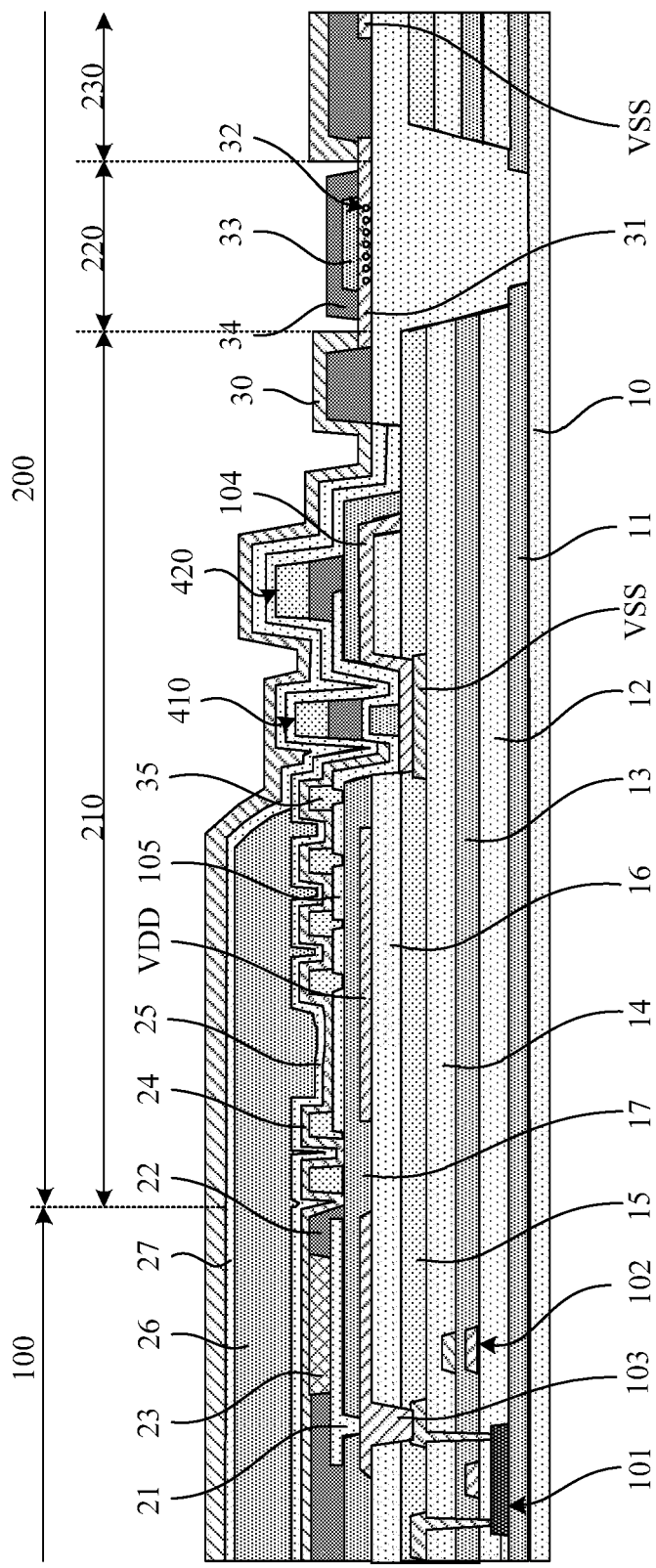
FIG. 14 is a schematic diagram of a structure of a display panel according to an exemplary embodiment of the present disclosure.

FIG. 14 is a schematic diagram of a structure of a display panel according to an exemplary embodiment of the present disclosure. As shown in FIG. 14, in a plane perpendicular to the display panel, the touch region 100 of the display panel includes a drive structure layer, a light-emitting structure layer disposed on the drive structure layer and a touch electrode layer disposed on the light-emitting structure layer. The binding region 200 of the display panel includes a composite insulating layer disposed on a base substrate 10 on which grooves are provided, a first planarization layer 16 disposed on the composite insulating layer with the grooves filled by the first planarization layer 16, a first power supply line VDD, a second power supply line VSS and a connecting line 31 provided on the first planarization layer 16, a first protective layer 33 and a second protective layer 34 provided on the connecting line 31, with two lead via holes which expose two ends of the connecting line 31 being provided on the second protective layer 34, and a fold line and an output line provided on the second protective layer 34, with the fold line being connected to one end of the connecting line 31 through one lead via hole and the output line being connected to the other end of the connecting line 31 through another lead via hole.

In the exemplary embodiment, the composite insulating layer includes a first insulating layer 11, a second insulating layer 12, a third insulating layer 13, a fourth insulating layer 14, and a fifth insulating layer 15 stacked on the base substrate 10. The grooves provided on the composite insulating layer include a first groove and a second groove. The first groove is provided on the first insulating layer and exposes the base substrate 10, and the second groove is provided on the second insulating layer 12, the third insulating layer 13, the fourth insulating layer 14, and the fifth insulating layer 15. An orthogonal projection of the second groove on the base substrate contains an orthogonal projection of the first groove on the base substrate.

In an exemplary embodiment, the connecting line 31 in the bending region 220 is configured to establish a connection between the fold line in the trace lead-out region 210 and the output line in the circuit region 230, so that touch signals pass through the bending region to reach the touch region.

In an exemplary embodiment, the drive structure layer in the touch region 100 includes a first transistor 101 and a first storage capacitor 102 which form a pixel driving circuit, and the light emitting structure layer in the touch region includes an anode, a pixel definition layer, an organic light emitting layer, a cathode and an encapsulation layer.

In an exemplary embodiment, the first power supply line VDD and the connecting line 31 are provided on the same layer and formed at the same time by a same patterning process, and the touch electrode layer in the touch region 100 and the fold lines in the trace lead-out region 210 and the output lines in the circuit region 230 are provided on the same layer and formed at the same time by a same patterning process.

A process for preparing a display panel is described schematically below. The "patterning process" described in the present disclosure includes treatments such as photoresist coating, mask exposure, development, etching and photoresist stripping for metal materials, inorganic materials or transparent conductive materials, and includes treatments such as organic material coating, mask exposure and development for organic materials. Deposition may include any one or more of sputtering, vapor deposition and chemical vapor deposition, coating may include any one or more of spraying coating, spin coating and ink-jet printing, and etching may include any one or more of dry etching and wet etching, which are not limited in the present disclosure. A "thin film" refers to a layer of thin film manufactured by a certain material on a base substrate using deposition, coating or other processes. If the "thin film" does not need the patterning process throughout the manufacturing process, the "thin film" may also be called a "film" before the patterning process, and is called a "layer" after the patterning process. If the "thin film" needs the patterning process throughout the manufacturing process, it is called a "thin film" before the patterning process, and called a "layer" after the patterning process. The "layer" after the patterning process contains at least one "pattern". "A and B are provided on the same layer" described in the present disclosure means that A and B are formed at the same time by a same patterning process, and a "thickness" of a film layer is the dimension of the film layer in the direction perpendicular to the display panel. In the exemplary embodiments of the present disclosure, "an orthogonal projection of A contains an orthogonal projection of B" means that a boundary of the orthogonal projection of B falls within a boundary range of the orthogonal projection of A, or the boundary of the orthogonal projection of A overlaps with the boundary of the orthogonal projection of B.

In an exemplary embodiment, a process for preparing the display panel includes the following operations.

(1) A base substrate 10 is prepared. In the exemplary embodiment, the base substrate 10 may include a first flexible material layer, a first inorganic material layer, a semiconductor layer, a second flexible material layer and a second inorganic material layer stacked on a glass carrier. Materials of the first and second flexible material layers may include polyimide (PI), polyethylene terephthalate (PET) or polymer soft film after surface treatment, and materials of the first and second inorganic material layers may include silicon nitride (SiNx) or silicon oxide (SiOx) to improve the anti-water-oxygen capability of the base substrate. The first and second inorganic material layers may also be called barrier layers, and amorphous silicon (a-si) may be used as a material of the semiconductor layer. In an exemplary embodiment, the base substrate 10 may have a laminated structure of PI1/Barrier1/a-si/PI2/Barrier2.

(2) A pattern of the composite insulating layer with grooves formed thereon is prepared on the base substrate 10. In the exemplary embodiment, the preparation process may include the following operations.

A first insulating thin film and an active layer thin film are deposited sequentially on the base substrate 10, the active layer thin film is patterned by a patterning process to form a first insulating layer 11 covering the entire base substrate 10, and a pattern of an active layer provided on the first insulating layer 11. The pattern of the active layer formed in the touch region 100 includes at least a first active layer. Then, a second insulating thin film and a first metal thin film are deposited sequentially, the first metal thin film is patterned by a patterning process to form a second insulating layer 12 covering the pattern of the active layer, and a pattern of a first gate metal layer provided on the second insulating layer 12. The pattern of the first gate metal layer forming in the touch region 100 includes at least a first gate electrode and a first capacitor electrode. Then, a third insulating thin film and a second metal thin film are deposited sequentially, the second metal thin film is patterned by the patterning process to form a third insulating layer 13 covering the first gate metal layer, and a pattern of a second gate metal layer provided on the third insulating layer 13. The pattern of the second gate metal layer forming in the touch region 100 includes at least a second capacitor electrode. Then, a fourth insulating thin film is deposited and patterned by a patterning process to form a pattern of a fourth insulating layer 14 covering the second gate metal layer. At least two first via holes are formed on the fourth insulating layer 14 in the touch region 100, and expose two ends of the first active layer respectively. Then, a third metal thin film is deposited and patterned by a patterning process to form a pattern of a first source-drain metal layer on the fourth insulating layer 14, the first source-drain metal layer at least includes a first source electrode and a first drain electrode which are formed in the touch region 100, and a second power supply line VSS formed in the trace lead-out region 210. The first source electrode and the first drain electrode are connected respectively to the two ends of the first active layer through the via holes. Then, a fifth insulating thin film is deposited to form a pattern of a fifth insulating layer 15 covering the source-drain metal layer.

After the current patterning process is completed, the patterning of the drive structure layer is completed in the touch region 100, and the patterning of the composite insulating layer is completed in the binding region 200. In the drive structure layer of the display region 100, the first active layer, the first gate electrode, the first source electrode and the first drain electrode form a first transistor 101, and the first capacitor electrode and the second capacitor electrode form a first storage capacitor 102. In an exemplary embodiment, the first transistor 101 may be a driving transistor in a pixel driving circuit, and the driving transistor may be a thin film transistor (TFT).

Then, the composite insulating layer in the bending region 220 is patterned by a patterning process to from the first groove and the second groove in the bending region 220. In an exemplary embodiment, the first groove and the second groove may be formed by two times of patterning process. First, the fifth insulating layer 15, the fourth insulating layer 14, the third insulating layer 13 and the second insulating layer 12 in the bending region 220 are etched by an etch bending A MASK (EBA MASK) to form the second groove, wherein the second groove exposes a surface of the first insulating layer 11. Then, the first insulating layer 11 in the second groove is etched by an etch bending B MASK (EBB MASK) to form the first groove on the first insulating layer 11, wherein the first groove exposes a surface of the base substrate 10. Thus, the second groove exposes the first groove, and the first groove exposes the base substrate to form a stepped groove structure. The composite insulation layer in the bending region 220 is grooved by the EBA MASK and EBB MASK processes, such that the thickness of the bending region can be reduced, facilitating regions except the bending region to be bent to the back of the display panel. In an exemplary embodiment, the second inorganic material layer of the base substrate 10 may be etched off in the EBA MASK process.

(3) A first planarization thin film of organic material is coated on the base substrate 10 with the foregoing patterns formed thereon, and a first planarization (PLN) layer 16 covering the entire base substrate 10 is formed by a patterning process. In the touch region 100, the first planarization layer 16 is provided with second via holes, and the first planarization layer 16 and the fifth insulating layer 15 in the second via holes are etched off to expose a surface of a first drain electrode of the first transistor 101. In the trace lead-out region 210, the first planarization layer 16 is provided with third via holes and a partition. The first planarization layer 16 and the fifth insulating layer 15 in the third via holes are etched off to expose a surface of the second power supply line VSS. The first planarization layer 16 in the partition is removed to expose a surface of the fifth insulating layer 15, blocking a region located in the trace lead-out region 210 adjacent to the bending region 220. The region is configured to make an inorganic layer in the encapsulation layer directly contact the fifth insulating layer 15 during subsequent encapsulation, to ensure encapsulation effect and process quality. In the bending region 220, the first planarization layer 16 completely fills the first groove and the second groove of the bending region 220.

(4) A fourth metal thin film is deposited on the flexible base substrate with the foregoing patterns formed thereon, the fourth metal thin film is patterned by a patterning process to form a pattern of a second source-drain metal layer on the first planarization layer 16. The second source-drain metal layer at least includes a first connection electrode 103 formed in the touch region 100, the first power supply line VDD and a second connection electrode 104 formed in the trace lead-out region 210, a connecting line 31 formed in the bending region 220, and the second power supply line VSS formed in the circuit region. In an exemplary embodiment, the first connection electrode 103 is connected to the first drain electrode of the first transistor 101 through a second via hole, and the second connection electrode 104 is connected to the second power supply line VSS through the third via holes and extends towards the bending region 220, covering the first planarization layer 16 between the third via holes and the spacer. The first power supply line VDD is located between the touch region 100 and the second power supply line VSS, and the connecting lines 31 are provided on the first planarization layer 16 in the bending region 220, which fills the first groove and the second groove.

In an exemplary embodiment, position of the first power supply line VDD or the second power supply line VSS in the trace lead-out region 210 may be arranged to correspond to position of the lead convergence region, that is, there is an overlapping region between an orthogonal projection of the first power supply line VDD or the second power supply line VSS on the base substrate and an orthogonal projection of the lead convergence region on the base substrate, so that the first power supply line VDD or the second power supply line VSS can provide a shielding function for the fold lines in the trace lead-out region, thereby preventing other data transmission lines from interfering with transmission of touch signals and improving the reliability of signal transmission.

In an exemplary embodiment, since both the trace lead-out region 210 and the circuit region 230 are provided with the second power supply line VSS, and the bending region 220 is located between the trace lead-out region 210 and the circuit region 230, the second power supply line VSS provided in the trace lead-out region 210 and the circuit region 230 can provide a lateral shielding function for the connecting lines 31 in the bending region 220, and improve the reliability of signal transmission.

In an exemplary embodiment, the multiple connecting lines 31 in the bending region 220 may include anti-fracture structures 32, which are configured to improve bending performance of the connecting lines 31 and prevent fractures occurring when the connecting lines 31 are bent.

(5) A second planarization thin film is coated on the base substrate 10 with the foregoing patterns formed thereon, and patterns of a second planarization layer 17, a planarization dam foundation and a first protective layer 33 are formed by a patterning process. In the touch region 100, fourth via holes are formed on the second planarization layer 17, and the second planarization layer 17 in the fourth via holes is developed away to expose a surface of the first connection electrode 103. Fifth via holes and an isolation region are provided on the second planarization layer 17 in the trace lead-out region 210. The planarization dam foundation is disposed on the second connection electrode 104 in the fifth via hole, and the second planarization layer 17 between the planarization dam foundation and sidewalls of the fifth via holes is removed to expose a surface of the second connection electrode 104. The isolation region is located in a region of the trace lead-out region 210 adjacent to the bending region 220, and the second planarization layer 17 in the isolation region is removed to expose a surface of the fifth insulating layer 15. In the bending region 220, the first protective layer 33 is disposed on the connecting lines 31, the first protective layer 33 has a position corresponding to the position of the anti-fracture structures 32, and is configured to protect the anti-fracture structures 32.

(6) A transparent conductive thin film is deposited on the base substrate with the foregoing patterns formed thereon, and the transparent conductive thin film is patterned by the patterning process to form patterns of an anode 21 and a third connection electrode 105. The anode 21 is formed on the second planarization player 17 in the touch region 310, and is connected to a first connection electrode 103 through a fourth via hole. The third connection electrode 105 is formed in the trace lead-out region 210, a part of the third connection electrode 105 is connected to the second connection electrode 104 through a fifth via hole, and another part of the third connection electrode is disposed on the second planarization layer 17 on one side of the fifth via hole adjacent to the touch region, and multiple sixth via holes are formed on the third connection electrode 105.

(7) A pixel definition thin film is coated on the base substrate with the foregoing patterns formed thereon, and the pixel definition thin film is patterned by a patterning process to form patterns of a pixel definition layer (PDL) 22, a first dam foundation, a second dam foundation and a second protective layer 34. In the touch region 100, a pixel opening is formed on the pixel definition layer 22, and the pixel opening exposes a surface of the anode 21. The first dam foundation and the second dam foundation are formed in the trace lead-out region 210 of the binding region 200. The first dam foundation is formed on the third connection electrode 105 in the fifth via hole, which is equivalent to being disposed on the planarization dam foundation, and the second dam foundation is formed on the second planarization layer 17 between the fifth via hole and the isolation region. The second protective layer 34 is formed in the bending region 220, a region of the trace lead-out region 210 adjacent to the bending region 220 and a region of the circuit region 230 adjacent to the bending region 220. The second protective layer 34 covers the first protective layer 33 and the connecting lines 31, and first lead via holes and second lead via holes are provided on the second protective layer 34. The first lead via holes are located at the first ends of the connecting lines 31 adjacent to the trace lead-out region 210 and the second lead via holes are located at the second ends of the connecting lines 31 adjacent to the circuit region 230. The pixel definition thin film of the first lead via holes and the second lead via holes is removed to expose surfaces of the connecting lines 31.

(8) A thin film of an organic material is coated on the flexible base substrate with the forgoing patterns formed thereon, and patterns of multiple post spacers (PS) 35 are formed through mask, exposure and development processes. The multiple post spacers 35 are formed respectively on the pixel definition layer 22 of the binding region 200, the first dam foundation 31 and the second dam foundation 32. The first dam foundation and the post spacers 35 thereon form a first support dam 410, and the planarization dam foundation, the second dam foundation and the post spacers 35 thereon form a second support dam 420.

(9) An organic light-emitting layer 23 and a cathode 24 are formed sequentially on the flexible base substrate with the foregoing patterns formed thereon. The organic light-emitting layer 23 may include a hole injection layer, a hole transport layer, a light-emitting layer, an electron transport layer and an electron injection layer which are stacked and formed in the pixel opening of the touch region 100. A part of the cathode 24 is formed on the organic light-emitting layer 23, and another part of the cathode 24 is formed on the pixel definition layer 22 between the pixel opening and the fifth via hole to wrap the multiple post spacers 35 on the pixel definition layer 22. The cathode 24 is connected to the third connection electrode 105. Since the third connection electrode 105 is connected to the second connection electrode 104 and the second connection electrode 104 is connected to the second power supply line VSS, connection between the cathode 24 and the second power supply line VSS is achieved.

(10) An encapsulation layer is formed on the basis of the foregoing patterns, wherein the encapsulation layer includes a first encapsulation layer 25, a second encapsulation layer 26 and a third encapsulation layer 27 which are stacked. The first encapsulation layer 25 is made of an inorganic material, covers the cathode 24 in the touch region 100, and wraps the multiple post spacers 35 and the first support dam 410 and the second support dam 420 in the binding region 200 respectively. The second encapsulation layer 26 is made of an organic material, and is disposed in the touch region 100 and in a region of the binding region 200 where the post spacers 35 are located. The third encapsulation layer 27 is made of an inorganic material, and covers the first encapsulation layer 25 and the second encapsulation layer 26 to ensure that external water vapor cannot enter the touch region 100. In an exemplary embodiment, the organic light-emitting layer 23 and the cathode 24 may be prepared using vapor deposition or inkjet printing, and the first encapsulation layer 25 and the third encapsulation layer 27 may be prepared by an open mask, so that the organic light-emitting layer, the cathode, the first and third encapsulation layers 25 and 27 are not formed in the bending region 220 and the circuit region 230. Since the first planarization layer 16 is formed with a partition exposing the surface of the fifth insulating layer 15 and the second planarization layer 17 is formed with an isolation region exposing the surface of the fifth insulating layer 15, the first encapsulation layer 25 and the third encapsulation layer 27 are directly formed on the fifth insulating layer 15 in the isolation region, thereby ensuring the encapsulation effect and process quality.

After the current patterning process is completed, the patterning of the light-emitting structure layer in the touch region 100 is completed, and the patterning of the circuit structure layer in the binding region is completed.

(11) A fifth metal thin film is deposited on the base substrate with the foregoing patterns formed thereon, and the fifth metal thin film is patterned by a patterning process to form a pattern of a touch electrode layer 30. In the touch region 100, the touch electrode layer 30 includes multiple touch electrodes and multiple touch traces. In the binding region 200, the touch electrode layer 30 in the trace lead-out region 210 includes multiple fold lines, and the touch electrode layer 30 in the circuit region 230 includes multiple output lines. The fold lines in the trace lead-out region 210 are connected to the first ends of the connecting lines 31 in the bending region 220 through the first lead via holes, and the output lines in the circuit region 230 are connected to the second ends of the connecting lines 31 in the bending region 220 through the second lead via holes, thereby enabling touch signals to pass through the bending region, as shown in FIG. 12.

The structure formed in the touch region through the preparation process described above includes:
 a first insulating layer 11 disposed on a base substrate 10;
 an active layer disposed on the first insulating layer 11, the active layer at least including a first active layer;
 a second insulating layer 12 covering the active layer;
 a first gate metal layer disposed on the second insulating layer 12, the first gate metal layer including at least a first gate electrode and a first capacitor electrode;
 a third insulating layer 13 covering the first metal gate layer;

a second gate metal layer disposed on the third insulating layer 13, the second gate metal layer including at least a second capacitor electrode;

a fourth insulating layer 14 covering the second gate metal layer, with at least two first via holes being formed on the fourth insulating layer 14, and the two first via holes exposing two ends of the first active layer respectively;

a first source-drain metal layer disposed on the fourth insulating layer 14, the first source-drain metal layer at least including a first source electrode and a first drain electrode which are connected respectively to the first active layer through the first via holes; the first source-drain metal layer further including a second power supply line VSS formed in the trace lead-out region 210;

a fifth insulating layer 15 covering the first source-drain metal layer and a first planarization layer 16, on which second via holes exposing the first drain electrode are formed;

a second source-drain metal layer disposed on the first planarization layer 16, the second source-drain metal layer at least including a first connection electrode 103, with the first connection electrode 103 being connected to the first drain electrode through the second via holes; the second source-drain metal layer further including a first power supply line VDD and a second connection electrode 104 formed in the trace lead-out region 210, and connecting lines 31 formed in the bending region 220, the second connection electrode 104 being connected to the second power supply line VSS;

a second planarization layer 17 covering the second source-drain metal layer, on which fourth via holes exposing the first connection electrode 103 are formed;

an anode 21 disposed on the second planarization layer 17, the anode 21 being connected to the first connection electrode 103 through the fourth via holes; the trace lead-out region 210 further including a third connection electrode 105 connected to the second connection electrode 104;

a pixel defining layer 22 disposed on the anode 21, on which pixel openings are formed, the pixel openings exposing the anode 21; the trace lead-out region 210 further including multiple post spacers 35;

an organic light emitting layer 23 disposed in the pixel openings, the organic light emitting layer 23 being connected to the anode 21;

a cathode 24 disposed on the organic light emitting layer 23, the cathode 24 being connected to the organic light emitting layer 23 and the third connection electrode 105 respectively;

an encapsulation layer covering the cathode 24; and a touch electrode layer 30 disposed on the encapsulation layer.

The structure formed in the bending region 220 of the binding region through the preparation process described above includes:

a composite insulating layer disposed on a base substrate 10, grooves being formed on the composite insulating layer, with the composite insulating layer including a first insulating layer 11, a second insulating layer 12, a third insulating layer 13, a fourth insulating layer 14 and a fifth insulating layer 15;

a first planarization layer 16 disposed on the composite insulating layer, the first planarization layer 16 completely filling the grooves;

connecting lines 31 arranged on the first planarization layer 16, the connecting lines 31 being provided with anti-fracture structures 32;

a first protective layer 33 disposed on the connecting lines 31, with the position of the first protective layer 33 corresponding to the positions of the anti-fracture structures 32;

a second protective layer 34 disposed on the connecting lines 31 and the first protective layer 33, with first lead via holes and second lead via holes being formed on the second protective layer 34, the first lead via holes being located at first ends of the connecting lines 31 adjacent to the touch region 100 and the second lead via holes being located at second ends of the connecting lines 31 away from the touch region 100, and the first lead via holes and the second lead via holes exposing surfaces of the connecting lines 31;

fold lines and output lines arranged on the second protective layer 34, the fold line being connected to the first ends of the connecting lines 31 through the first lead via holes, and the output lines being connected to the second ends of the connecting lines 31 through the second lead via holes; the fold lines being arranged in the trace lead-out region, and the output lines being arranged in the circuit region.

In an exemplary embodiment, the first, second, third, fourth and fifth insulating layers may be made of any one or more of silicon oxide (SiOx), silicon nitride (SiNx) and silicon oxynitride (SiON), and may be single layers, multiple layers or composite layers. The first insulating layer is called a buffer layer used for improving the anti-water-oxygen capability of the base substrate, the second insulating layer and the third insulating layer are called gate insulating (GI) layers, the fourth insulating layer is called an interlayer dielectric (ILD) layer, and the fifth insulating layer is called a passivation (PVX) layer. The first planarization layer and the second planarization layer may be made of organic materials. The first, second, third, fourth and fifth metal thin films may be made of metal materials, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may have a single-layer structure or a multi-layer composite structure, such as Ti/Al/Ti. The transparent conductive thin film may be made of indium tin oxide (ITO) or indium zinc oxide (IZO), and the pixel definition layer may be made of polyimide, acrylic or polyethylene terephthalate, etc. The cathode may be made of any one or more of magnesium (Mg), silver (Ag), aluminum (Al), copper (Cu) and lithium (Li), or an alloy of any one or more of the above metals. The active layer thin film may be made of various materials such as amorphous indium gallium zinc oxide (a-IGZO), zinc oxynitride (ZnON), indium zinc tin oxide (IZTO), amorphous silicon (a-Si), polysilicon (p-Si), hexathiophene and polythiophene, that is, the present disclosure is applicable to transistors manufactured based on an oxide technology, a silicon technology and an organic compound technology.

In the exemplary embodiments of the present disclosure, the connecting lines are formed in the bending region using the second source-drain metal layer, so as to implement the connection of the touch signals between the trace lead-out region and the circuit region, and ensure transmission of the signals. The bending performance of the connecting lines is improved by the anti-fracture structures of the connecting lines. The shielding function is provided for the folding lines in the trace lead-out region through the first power supply line or the second power supply line, and the lateral shielding function is provided for the connecting lines in the bending region through the second power supply line in the trace lead-out region and the circuit region, thereby improving the reliability of signal transmission.

The structure of the display panel and the preparation process of thereof according to the exemplary embodiments of the present disclosure are merely illustrative. In the exemplary embodiments, corresponding structures may be changed and patterning processes may be added or reduced according to actual needs, which is not limited in the present disclosure.

The present disclosure further provides a method for preparing a touch panel, wherein the touch panel includes a touch region and a binding region located on one side of a first direction of the touch region, and the binding region includes a trace lead-out region adjacent to the touch region; the preparation method includes:

forming n touch sub-regions disposed sequentially along a second direction in the touch region, and forming n lead convergence regions disposed sequentially along the second direction in the trace lead-out region, wherein at least one touch sub-region includes multiple touch electrodes and multiple touch traces; and connecting first ends of multiple touch traces in an i-th touch sub-region to the multiple touch electrodes in the i-th touch sub-region respectively, and extending second ends of the multiple touch traces in the i-th touch sub-region to an i-th lead convergence region in the trace lead-out region; wherein in the first direction, the i-th lead convergence region does not overlap with other touch sub-regions except the i-th touch sub-region, or other lead convergence regions except the i-th lead convergence region do not overlap with the i-th touch sub-region; n is a positive integer greater than 2, i=1, 2, . . . , n, and the second direction crosses the first direction.

In an exemplary embodiment, the i-th lead convergence region includes multiple fold lines, which are configured to be electrically connected to the multiple touch traces in the i-th touch sub-region and converge together to form the i-th lead convergence region; convergence directions of the fold lines in the n lead convergence regions are asymmetric with respect to a center line extending along the first direction in the trace lead-out region.

In an exemplary embodiments, the convergence directions of the fold lines in the n lead convergence regions being asymmetric with respect to the center line extending along the first direction in the trace lead-out region includes any one or more of the following cases: a quantity of fold lines bending towards the second direction in the first lead convergence region is different from a quantity of fold lines bending towards the second direction in an n-th lead convergence region, or a quantity of fold lines bending towards the second direction in the second lead convergence region is different from a quantity of fold lines bending towards the second direction in an (n−1)-th lead convergence region.

The present disclosure further provides a display apparatus including the touch panel according to the embodiments described above. The display apparatus may be any product or component with a display function, such as a mobile phone, a tablet computer, a television, a display, a laptop computer, a digital photo frame, a navigator, etc.

The drawings of the present application are only related to the structures involved in the present disclosure, and general designs may be referred to for other structures. The embodiments of the present disclosure, i.e., features in the embodiments may be combined with each other to obtain new embodiments if there is conflict.

Those of ordinary skills in the art will understand that modifications or equivalent substitutions may be made to the technical solutions of the present disclosure without departing from the spirit and scope of the technical solutions of the present application, and shall be covered within the scope of the claims of the present application.

What is claimed is:

1. A touch panel comprising a touch region and a binding region located on one side of a first direction of the touch region; wherein the touch region comprises n touch sub-regions disposed sequentially along a second direction, and at least one of the touch sub-regions comprises a plurality of touch electrodes and a plurality of touch traces; the binding region comprises a trace lead-out region adjacent to the touch region, and the trace lead-out region comprises n lead convergence regions disposed sequentially along the second direction; first ends of a plurality of touch traces in an i-th touch sub-region are connected respectively to a plurality of touch electrodes in the i-th touch sub-region, and second ends of the plurality of touch traces in the i-th touch sub-region extend to an i-th lead convergence region of the trace lead-out region; in the first direction, the i-th lead convergence region does not overlap with other touch sub-regions except the i-th touch sub-region, or other lead convergence regions except the i-th lead convergence region do not overlap with the i-th touch sub-region; wherein n is a positive integer greater than 2, i=1, 2, . . . , n, and the second direction crosses the first direction;

wherein the i-th lead convergence region comprises a plurality of fold lines, which are configured to be electrically connected to the plurality of touch traces in the i-th touch sub-region and converge together to form the i-th lead convergence region; convergence directions of the fold lines in the n lead convergence regions are asymmetric with respect to a center line extending along the first direction in the trace lead-out region.

2. The touch panel according to claim 1, wherein the convergence directions of the fold lines in the n lead convergence regions being asymmetric with respect to the center line extending along the first direction in the trace lead-out region comprises any one or more of following cases: a quantity of fold lines bending towards the second direction in a first lead convergence region is different from a quantity of fold lines bending towards the second direction in an n-th lead convergence region, or a quantity of fold lines bending towards the second direction in a second lead convergence region is different from a quantity of fold lines bending towards the second direction in an (n−1)-th lead convergence region.

3. The touch panel according to claim 1, wherein the binding region further comprises a bending region located on one side of the trace lead-out region away from the touch region; at least one of the lead convergence regions comprises a plurality of first fold lines and a plurality of second fold lines; first ends of the first fold lines are connected to the touch traces in the touch region, and second ends of the first fold lines bend towards the second direction and extend to the bending region; first ends of the second fold lines are connected to the touch traces of the touch region, and second ends of the second fold lines bend towards an opposite direction of the second direction and extend to the bending region.

4. The touch panel according to claim 3, wherein the first fold lines at least comprise first lead-out lines, first turning lines and first extension lines which are connected sequentially; first ends of the first lead-out lines are connected to the touch traces of the touch region, and second ends of the first lead-out lines are connected to first ends of the first turning lines after extending towards the first direction; second ends of the first turning lines are connected to first ends of the first extension lines after extending towards the second direction; second ends of the first extension lines extend towards the first direction to the bending region; and the second fold lines at least comprise second lead-out lines, second turning lines and second extension lines which are connected sequentially; first ends of the second lead-out lines are connected to the touch traces of the touch region, and second ends of the second lead-out lines are connected to first ends of the second turning lines after extending towards the first direction; second ends of the first turning lines are connected to first ends of the second extension lines after extending towards the opposite direction of the second direction; second ends of the second extension lines extend towards the first direction to the bending region.

5. The touch panel according to claim 1, wherein the touch region comprises N electrode regions and N lead regions which are disposed alternately along the second direction, at least one of the electrode regions comprises M touch electrodes arranged sequentially along the first direction, and at least one of the lead regions comprises M touch traces arranged sequentially along the second direction; a first end of at least one touch trace of the M touch traces is connected to one of the touch electrodes, and a second end of the touch trace extends to the trace lead-out region of the binding region along the first direction; wherein M and N are positive integers greater than 2.

6. The touch panel according to claim 5, wherein the touch region comprises five touch sub-regions disposed sequentially along the second direction, and the trace lead-out region comprises five lead convergence regions disposed sequentially along the second direction.

7. The touch panel according to claim 6,
wherein the five touch sub-regions comprise a first, second, third, fourth and fifth touch sub-regions, each of the first, the third and the fifth touch sub-regions comprises four electrode regions and four lead regions, and each of the second and the fourth touch sub-regions comprises two electrode regions and two lead regions; the five lead convergence regions comprise a first, second, third, fourth and fifth lead convergence regions, the first lead convergence region is configured to converge 4M touch traces of the four lead regions in the first touch sub-region, the second lead convergence region is configured to converge 2M touch traces of the two lead regions in the second touch sub-region, the third lead convergence region is configured to converge 4M touch traces of the four lead regions in the third touch sub-region, the fourth lead convergence region is configured to converge 2M touch traces of the two lead regions in the fourth touch sub-region, and the fifth lead convergence region is configured to converge 4M touch traces of the four lead regions in the fifth touch sub-region.

8. The touch panel according to claim 7, wherein the first lead convergence region comprises 2M first fold lines bending towards the second direction and 2M second fold lines bending towards the opposite direction of the second direction.

9. The touch panel according to claim 7, wherein the second lead convergence region comprises 2M second fold lines bending towards the opposite direction of the second direction.

10. The touch panel according to claim 7, wherein the third lead convergence region comprises M first fold lines bending towards the second direction and 3M second fold lines bending towards the opposite direction of the second direction.

11. The touch panel according to claim 7, wherein the fourth lead convergence region comprises M first fold lines bending towards the second direction and M second fold lines bending towards the opposite direction of the second direction.

12. The touch panel according to claim 7, wherein the fifth lead convergence region comprises M first fold lines bending towards the second direction and 3M second fold lines bending towards the opposite direction of the second direction.

13. The touch panel according to claim 1, wherein the binding region further comprises a bending region located on one side of the trace lead-out region away from the touch region and a circuit region located on one side of the bending region away from the touch region; the bending region comprises n connecting line convergence regions disposed sequentially along the second direction, and the circuit region comprises m output line convergence regions disposed at intervals along the second direction and a plurality of multiplexer circuits; an i-th connecting line convergence region comprises a plurality of connecting lines, first ends of the plurality of connecting lines of the i-th connecting line convergence region are connected respectively to second ends of a plurality of fold lines of the i-th connecting line convergence region, second ends of the plurality of connecting lines of the i-th connecting convergence region are connected to first ends of a plurality of output lines of a j-th output line convergence region, and second ends of the plurality of output lines of the j-th output line convergence region are connected to a multiplexer circuit; wherein m is a positive integer greater than or equal to 2, and m is less than n, i=1, 2, . . . , n, j=1, 2, . . . , m.

14. The touch panel according to claim 13, wherein the bending region comprises a first, second, third, fourth and fifth connecting line convergence regions disposed sequentially along the second direction; the circuit region comprises two output line convergence regions and two multiplexer circuits;

first ends of a plurality of output lines of a first output line convergence region are connected respectively to second ends of a plurality of connecting lines in the first, the second and the third connecting line convergence regions, and second ends of the plurality of output lines in the first output line convergence region are connected to a first multiplexer circuit; first ends of a plurality of output lines of a second output line convergence region are connected respectively to second ends of a plurality of connecting lines in the fourth and the fifth connecting line convergence regions, and second ends of the plurality of output lines of the second output line convergence region are connected to a second multiplexer circuit; or the first ends of the plurality of output lines of the first output line convergence region are connected respectively to the second ends of the plurality of connecting lines in the first and the second connecting line convergence regions, and the second ends of the plurality of output lines of the first output line convergence region are connected to the first multiplexer circuit; the first ends of the plurality of output lines of the second output line convergence region are connected respectively to the second ends of the plurality of connecting lines in the third, fourth and fifth connecting line convergence regions, and the second ends of the plurality of output lines of the second output line convergence region are connected to the second multiplexer circuit; or the first ends of the plurality of output lines of the first output line convergence region are connected respectively to second ends of all connecting lines of the first connecting line convergence region, all connecting lines of the second connecting line convergence region and part of the connecting lines of the third connecting line convergence region, and the second ends of the plurality of output lines of the first output line convergence region are connected to the first multiplexer circuit; the first ends of the plurality of output lines of the second output line convergence region are connected respectively to second ends of another part of the connecting lines of the third connecting line convergence region, all connecting lines of the fourth connecting line convergence region and all connecting lines of the fifth connecting line convergence region, and the second ends of the plurality of output lines of the second output line convergence region are connected to the second multiplexer circuit.

15. The touch panel according to claim 1, wherein the touch region comprises N composite electrode regions disposed sequentially along the second direction, and at least one of the composite electrode regions comprises M touch electrodes arranged sequentially along the first direction and M touch traces arranged sequentially along the second direction, and there is an overlapping region between an orthogonal projection of the M touch traces on a plane of the touch panel and an orthogonal projection of the M touch electrodes on the plane of the touch panel; a first end of at least one touch trace of the M touch traces is connected to one of the touch electrodes, and a second end of the touch trace extends to the trace lead-out region of the binding region along the first direction; wherein M and N are positive integers greater than 2.

16. The touch panel according to claim 1, wherein in a plane perpendicular to the touch panel, the bending region of the binding region comprises:

a composite insulating layer disposed on a base substrate, wherein grooves are formed on the composite insulating layer;
a first planarization layer disposed on the composite insulating layer, wherein the first planarization layer fills the grooves;
connecting lines arranged on the first planarization layer, wherein the connecting lines are provided with anti-fracture structures;
a first protective layer disposed on the connecting lines, wherein position of the first protective layer corresponds to positions of the anti-fracture structures;
a second protective layer disposed on the connecting lines and the first protective layer, wherein first lead via holes and second lead via holes exposing the connecting lines are formed on the second protective layer, the first lead via holes are located at first ends of the connecting lines adjacent to the touch region, and the second lead via holes are located at the second ends of the connecting lines away from the touch region; and
fold lines and output lines arranged on the second protective layer, wherein the fold lines are connected to the first ends of the connecting lines through the first lead via holes, and the output lines are connected to the second ends of the connecting lines through the second lead via holes.

17. The touch panel according to claim 13, wherein the trace lead-out region of the binding region further comprises a first power supply line and a second power supply line; there is an overlapping region between an orthogonal projection of the n lead convergence regions on a plane of the touch panel and an orthogonal projection of the first power supply line or the second power supply line on the plane of the touch panel.

18. The touch panel according to claim 13, wherein the circuit region of the binding region further comprises a first power supply line and a second power supply line; there is an overlapping region between an orthogonal projection of the m output line convergence regions on a plane of the touch panel and an orthogonal projection of the first power supply line or the second power supply line on the plane of the touch panel.

19. A display apparatus comprising the touch panel according to claim 1.

* * * * *